United States Patent
Nitta

(10) Patent No.: US 8,502,322 B2
(45) Date of Patent: Aug. 6, 2013

(54) NONVOLATILE MEMORY DEVICE AND MANUFACTURING METHOD THEREOF

(75) Inventor: Hiroyuki Nitta, Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 97 days.

(21) Appl. No.: 13/044,973

(22) Filed: Mar. 10, 2011

(65) Prior Publication Data

US 2011/0233505 A1  Sep. 29, 2011

(30) Foreign Application Priority Data

Mar. 23, 2010 (JP) .................................. 2010-066801

(51) Int. Cl.
*H01L 21/00* (2006.01)
*H01L 27/108* (2006.01)
*H01L 29/94* (2006.01)
*H01L 29/06* (2006.01)
*H01L 47/00* (2006.01)

(52) U.S. Cl.
USPC ......... 257/390; 257/5; 257/296; 257/E21.662

(58) Field of Classification Search
USPC ................. 257/2–5, 296, 390, 758; 438/381, 438/382, 622, 699
See application file for complete search history.

(56) References Cited

U.S. PATENT DOCUMENTS

| | | | |
|---|---|---|---|
| 2008/0258262 A1* | 10/2008 | Nagai | 257/535 |
| 2009/0106727 A1* | 4/2009 | McCullen | 716/12 |
| 2009/0261315 A1* | 10/2009 | Toda et al. | 257/5 |
| 2010/0038616 A1* | 2/2010 | Nagashima et al. | 257/2 |
| 2010/0187591 A1 | 7/2010 | Nagashima | |
| 2011/0049465 A1 | 3/2011 | Nagashima | |

FOREIGN PATENT DOCUMENTS

| | | |
|---|---|---|
| JP | 2009-004725 | 1/2009 |
| JP | 2009-049178 | 3/2009 |
| JP | 2009-130140 | 6/2009 |
| JP | 2009-199713 | 9/2009 |
| JP | 2009-260060 | 11/2009 |

OTHER PUBLICATIONS

U.S. Appl. No. 12/821,585, filed Jun. 23, 2010, Takayuki Toba, et al.

* cited by examiner

*Primary Examiner* — Matthew Landau
*Assistant Examiner* — Khaja Ahmad
(74) *Attorney, Agent, or Firm* — Oblon, Spivak, McClelland, Maier & Neustadt, L.L.P.

(57) ABSTRACT

According to the nonvolatile memory device in one embodiment, contact plugs connect between second wires and third wires in a memory layer and a first wire connected to a control element. Drawn wire portions connect the second wires and the third wires with the contact plug. The drawn wire portion connected to the second wires and the third wires of the memory layer is formed of a wire with a critical dimension same as the second wires and the third wires and is in contact with the contact plug on an upper surface and both side surfaces of the drawn wire portion.

8 Claims, 28 Drawing Sheets

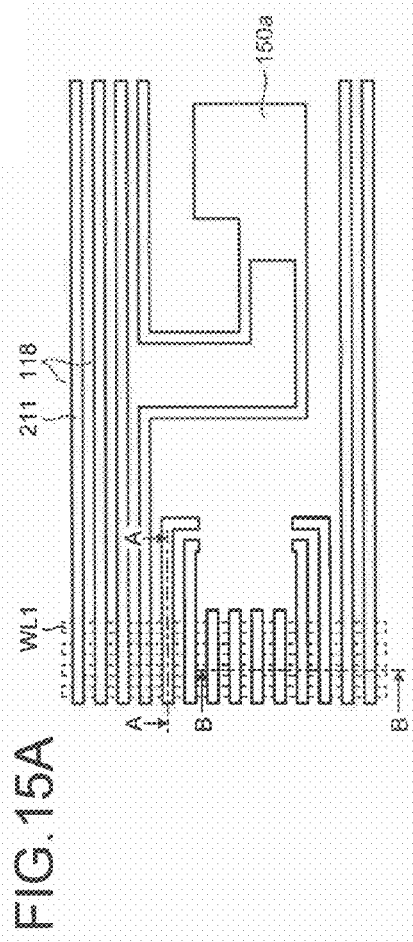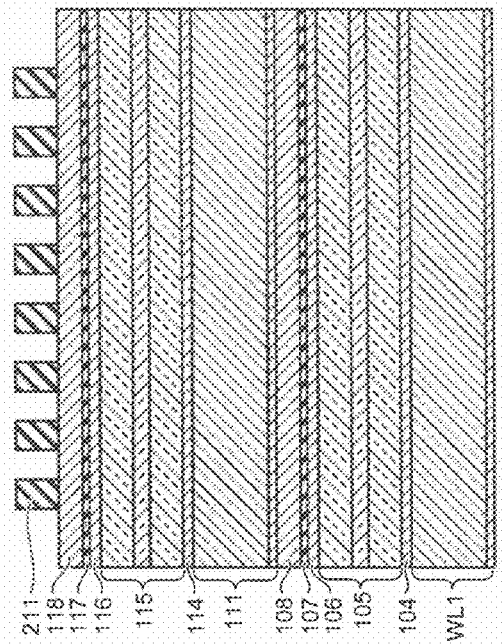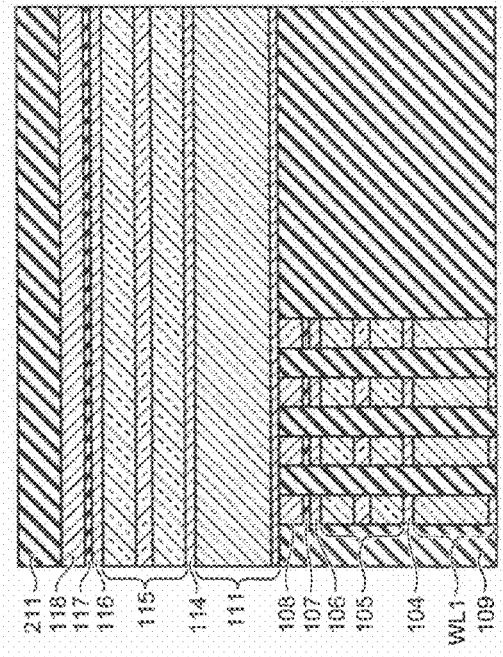

NONVOLATILE MEMORY DEVICE AND MANUFACTURING METHOD THEREOF

CROSS-REFERENCE TO RELATED APPLICATIONS

This application is based upon and claims the benefit of priority from the prior Japanese Patent Application No. 2010-066801, filed on Mar. 23, 2010; the entire contents of which are incorporated herein by reference.

FIELD

Embodiments described herein relate generally to a nonvolatile memory device and a manufacturing method thereof.

BACKGROUND

In recent years, a three-dimensional cross-point type nonvolatile memory device is proposed. This nonvolatile memory device includes a memory layer in which a plurality of memory cell array layers is stacked in a height direction. In the memory cell array layer, nonvolatile memory cells, in each of which a rectifying element and a nonvolatile memory element such as a variable resistive element are connected in series, are arranged to be sandwiched at intersection positions of a plurality of word lines and a plurality of bit lines formed at a height different from the word lines. Moreover, peripheral circuits such as a column control circuit that controls the bit lines of the memory cell array layer and performs access to a memory cell and a row control circuit that selects a word line of the memory cell array layer and applies a voltage needed for access to the memory cell are provided at a lower portion of the memory cell array layer above a semiconductor substrate. Therefore, the word lines and the bit lines drawn to a region out of a memory-cell forming region and the peripheral circuits are connected by word line contacts and bit line contacts that are provided to penetrate through the memory layer (for example, see Japanese Patent Application Laid-open No. 2009-130140).

As disclosed in Japanese Patent Application Laid-open No. 2009-130140, while the word line contact can be shared by a plurality of word lines formed at the same position in a plan view, the bit line contact is provided to all of bit lines provided in the memory layer. Therefore, in the three-dimensional cross-point type nonvolatile memory device, with the increase of word lines and bit lines, many word line contacts and bit line contacts are needed, so that a problem arises in that an area of a memory cell including the memory-cell forming region and a contact forming region in which the word line contacts and the bit line contacts are formed increases.

BRIEF DESCRIPTION OF THE DRAWINGS

FIG. 3A to FIG. 17D are diagrams schematically illustrating an example of a manufacturing method of the nonvolatile memory device;

DETAILED DESCRIPTION

In general, according to one embodiment, a nonvolatile memory device that includes a peripheral circuit that includes a control element that controls a nonvolatile memory cell formed above a substrate, a first wire that is formed above the peripheral circuit via an inter-layer dielectric film and is connected to the control element, a memory layer in which a plurality of second wires and a plurality of third wires are arranged at intersection positions, contact plugs, and drawn wire portions. The second wires extend in a first direction and the third wires are formed at a height different from the second wires and extend in a second direction. The memory layer has a structure in which a plurality of memory-cell-array layers is stacked above the inter-layer dielectric film in which the first wire is formed. The memory-cell-array layer includes a plurality of nonvolatile memory cells each of which includes a nonvolatile memory element arranged at the intersection positions of the second wires and the third wires to be sandwiched between the second wires and the third wires. The contact plugs connect between the second wires and the first wire and between the third wires and the first wire, and are formed in a peripheral portion of the memory layer. The drawn wire portions connect the second wires and the third wires with the contact plugs in the memory layer. The drawn wire portion that is connected to a second wire and a third wire other than a second wire and a third wire of a bottom layer and a top layer of the memory layer is formed of a wire with a critical dimension in the nonvolatile memory device same as the second wires and the third wires and is in contact with the contact plug on an upper surface and both side surfaces of the drawn wire portion.

A nonvolatile memory device and a manufacturing method thereof according to the embodiments will be explained below in detail with reference to the accompanying drawings. The present invention is not limited to these embodiments. The cross-sectional views of the nonvolatile memory device used in the following embodiments are schematic ones, and the relationship between a thickness and a width of a film, a ratio of a thickness of respective films, and the like are different from realistic ones. Moreover, a film thickness illustrated below is an example and is not limited to this.

In the following, explanation is given for the case of manufacturing the nonvolatile memory device by applying a technology used in a conventional manufacturing process of a semiconductor device for miniaturization of the nonvolatile memory device, and the embodiments are explained after pointing out problems thereof.

Figure 1:
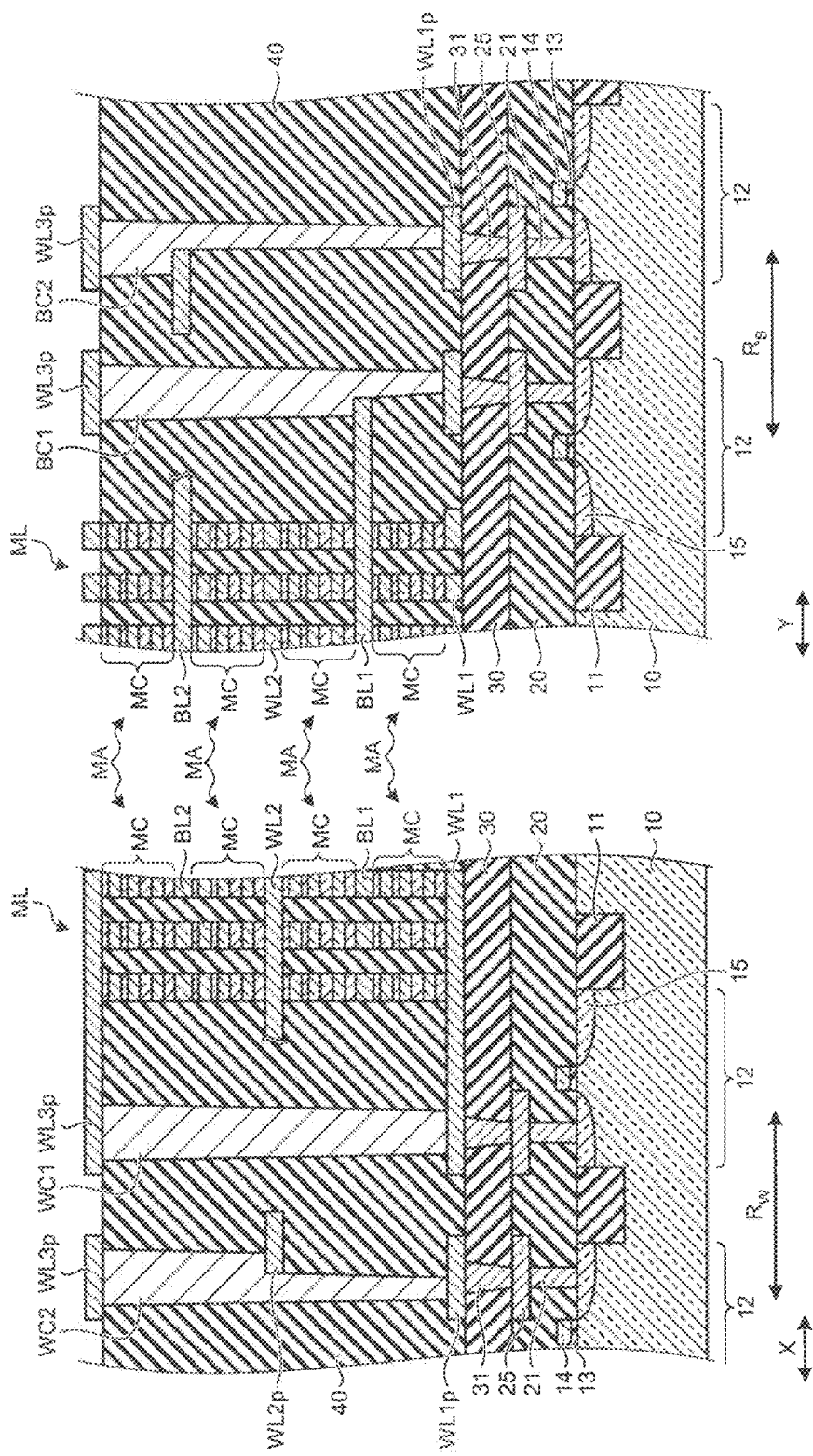
FIG. 1A and FIG. 1B are cross-sectional views schematically illustrating an example of a structure of a nonvolatile memory device.
Figure 2:
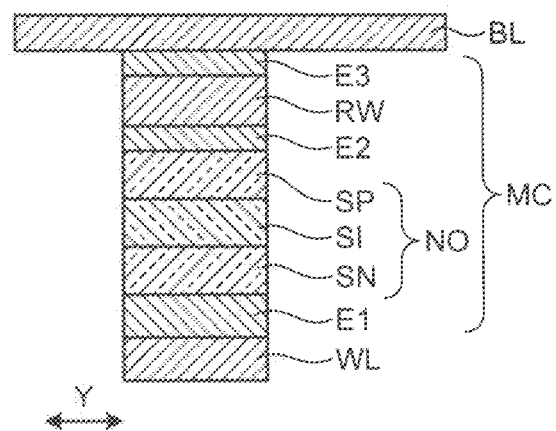
FIG. 2 is a cross-sectional view schematically illustrating a structure of one memory cell illustrated in FIG. 1A and FIG. 1B.

FIG. 1A and FIG. 1B are cross-sectional views schematically illustrating an example of a structure of the nonvolatile memory device, in which FIG. 1A is a diagram schematically illustrating part of a cross section in a direction parallel to an extending direction of a word line and FIG. 1B is a diagram schematically illustrating part of a cross section in a direction vertical to the extending direction of a word line. FIG. 2 is a cross-sectional view schematically illustrating a structure of one memory cell illustrated in FIG. 1A and FIG. 1B.

As shown in FIG. 1A and FIG. 1B, a peripheral circuit that includes a cell control transistor 12 that controls memory cells MC is formed above a semiconductor substrate 10 such as a silicon substrate. The cell control transistor 12 includes a gate electrode 14 that is formed on a region on the surface of the semiconductor substrate 10 separated by an isolation dielectric film 11 via a gate dielectric film 13, and a source/drain region 15 that is formed on the surface of the semiconductor substrate 10 on both sides of the gate electrode 14 in a line width direction. A first inter-layer dielectric film 20 is formed above the semiconductor substrate 10 on which the cell control transistor 12 is formed, and a lower-layer wire 25 is formed to be embedded in the inter-layer dielectric film 20 near the upper surface. The lower-layer wire 25 is connected to the source/drain region 15 of the cell control transistor 12 via a contact 21 formed in the inter-layer dielectric film 20. Moreover, a second inter-layer dielectric film 30 is formed above the inter-layer dielectric film 20, and on the second inter-layer dielectric film 30, a memory layer ML, and word line contacts WC1 and WC2 and bit line contacts BC1 and BC2 that connect word lines WL and bit lines BL connected to each memory cell MC of the memory layer ML to the lower-layer wires 25 connected to the cell control transistor 12 are formed. A third inter-layer dielectric film 40 is formed around each memory cell MC and around the word line contact WC and the bit line contact BC. For the contact, a hole portion is called a contact hole and a conductive portion in the contact hole is called a contact plug in the following in some cases.

The memory layer ML has a structure in which a plurality of memory-cell array layers MA in each of which the memory cells MC are arranged in a matrix manner is stacked in a height direction. Each memory cell array layer MA has a structure in which a plurality of the word lines WL extending in an X direction and a plurality of the bit lines BL extending in a Y direction vertical to the X direction at a height different from the word lines WL are arranged intersecting with each other, and a variable resistance memory cell (hereinafter, simply referred to as memory cell in some cases) MC in which a non-ohmic element and a variable resistive element are connected in series is arranged at each intersection position. The word line WL or the bit line BL is shared between the memory cells MC adjacent in the height direction. In the example in FIG. 1A and FIG. 1B, the case is illustrated in which four memory cell array layers MA are arranged in the memory layer ML by three word lines WL1 to WL3 and two bit lines BL1 and BL2.

As shown in FIG. 2, the memory cell MC has a structure in which a first electrode layer E1, a non-ohmic element NO, a second electrode layer E2, a variable resistive element RW, and a third electrode layer E3 are stacked in order. The electrode layer E1 has a function as an adhesion layer and a barrier metal layer between the word line WL and the non-ohmic element NO.

The non-ohmic element NO is provided for causing current flowing in the memory cell MC to flow in a predetermined direction (for example, direction from the word line WL to the bit line BL). Examples of this non-ohmic element NO include a PIN diode, a PN junction diode, a Schottky diode, and a MIM (Metal-Insulator-Metal) element. FIG. 2 illustrates the case in which a PIN diode formed by stacking an N-type semiconductor layer SN, an I-type semiconductor layer SI, and a P-type semiconductor layer SP is used as the non-ohmic element NO.

The second electrode layer E2 has a function as an adhesion layer and a barrier metal layer between the non-ohmic element NO and the variable resistive element RW and a function as an electrode layer of the variable resistive element RW. The variable resistive element RW is formed of a metal oxide capable of switching between a high resistance state and a low resistance state by controlling a voltage value and an application time. An example of the variable resistive element RW is a metal oxide film that includes at least one of elements of Si, Ti, Ta, Nb, Hf, Zr, W, Al, Ni, Co, Mn, Fe, Cu, Mo, and the like. The third electrode layer E3 has a function as an adhesion layer and a barrier metal layer between the variable resistive element RW and the bit line BL and a function as an electrode layer of the variable resistive element RW.

The first, second, and third electrode layers E1, E2, and E3 are formed of the same material or materials with different combinations selected from conductive materials such as Pt, Au, Ag, TiAlN, SrRuO, Ru, RuN, Ir, Co, Ti, TiN, TaN, LaNiO, Al, PtIrOX, PtRhOX, Rh, and TaAlN. The combination of the materials of each of the first, second, and third electrode layers E1, E2, and E3 is appropriately selected from materials used in the non-ohmic element NO and the variable resistive element RW.

Returning to FIG. 1A and FIG. 1B, the word lines WL1 to WL3 and the bit lines BL1 and BL2 of each memory cell array layer MA are formed to extend to word-line-contact forming regions RW and bit-line-contact forming regions RB adjacent to the formation position of the memory cell array layer MA. As shown in FIG. 1A and FIG. 1B, the word lines WL1 to WL3 formed at the same position (at different heights) in a plan view are connected to the common word line contacts WC1 and WC2 every other layer. In other words, the word lines WL1 and WL3 are connected to the word line contact WC1 in common and the word line WL2 is connected to the word line contact WC2.

Moreover, the word line contacts WC1 and WC2 are both provided to penetrate through the third inter-layer dielectric film 40 for four memory cell array layers MA. The word line contact WC1 penetrates through the third inter-layer dielectric film 40 with approximately the constant diameter, however, the word line contact WC2 is formed to have a first cross-sectional area up to the word line WL2 and partially overlap with the word line WL2 drawn to the word-line-contact forming region RW, and is formed to have a second cross-sectional area obtained by subtracting the overlapping region from the first area on the lower side of the connection portion with the word line WL2.

Furthermore, the word line contacts WC1 and WC2 are connected to a landing pad WL1*p* at the lower ends thereof and are connected to a landing pad WL3*p* to be a lid of the word line contacts WC1 and WC2 at the upper ends thereof. The landing pads WL1*p* and WL3*p* connected to the word line contact WC1 are formed to be connected to the word lines WL1 and WL3, respectively. Each of the word line contacts WC1 and WC2 is connected to a driver via the landing pad WL1p and the lower-layer wire 25.

The bit lines BL1 and BL2 formed at the same position (at different heights) in a plan view are connected to different bit-line contacts BC1 and BC2, respectively. In other words, the bit line BL1 is connected to the bit line contact BC1 and the bit line BL2 is connected to the bit line contact BC2. In the similar manner to the word line contacts WC1 and WC2, the bit line contacts BC1 and BC2 are provided to penetrate through the third inter-layer dielectric film 40 for four memory cell array layers MA. The bit line contact BC1 is formed to have a first cross-sectional area up to the bit line BL1 and partially overlap with the bit line BL1, and is formed to have a second cross-sectional area obtained by subtracting the overlapping region from the first area on the lower side of the connection portion with the bit line BL1. In the similar manner, the bit line contact BC2 is formed to have a first cross-sectional area up to the bit line BL2 and partially overlap with the bit line BL2, and is formed to have a second cross-sectional area obtained by subtracting the overlapping region from the first area on the lower side of the connection portion with the bit line BL2.

Moreover, the lower end and the upper end of each of the bit line contacts BC1 and BC2 are connected to the landing pads WL1p and WL3p, respectively. Each of the bit line contacts BC1 and BC2 is connected to a driver via the landing pad WL1p and the lower-layer wire 25. Each of the bit line contacts BC1 and BC2 is connected to both drivers of an N-type MIS (Metal-Insulator-Semiconductor) transistor and a P-type MIS transistor. This is for selecting one of the memory cells MC connected to the upper and lower sides of bit line BL by changing a polarity of a voltage applied to the word line WL and performing a reset process and a set process to be described later. In the following, a portion in which part of the word line contact WC is connected to the word line WL in an overlapping manner and a portion in which part of the bit line contact BC is connected to the bit line BL in an overlapping manner are called a drawn wire portion.

FIG. 1A illustrates a cross section on a certain word-line formation position, however, for all of other word lines WL1 to WL3 formed in parallel in a direction vertical to the paper surface, the word line contacts WC1 and WC2 are provided in the similar manner and the word lines are connected to the common word line contacts WC1 and WC2 every other layer. FIG. 1B illustrates a cross section on a certain bit-line formation position, however, for all of the bit lines BL1 and BL2 formed in parallel in a direction vertical to the paper surface, the bit line contacts BC1 are BC2 are formed for every bit lines BL1 and BL2.

In FIG. 1A and FIG. 1B, the case is explained in which four memory cell array layers MA are stacked, however, the structure is similar also in the case of stacking a plurality of the memory cell array layers MA. For example, when eight memory cell array layers MA are stacked, four memory cell array layers MA are further stacked on the four memory cell array layers MA illustrated in FIG. 1A and FIG. 1B. In this case, the bit line BL formed at the same position in a plan view is further increased by two, so that the bit line contact BC is also increased by two. The word line WL formed at the same position in a plan view is increased by two, however, these word lines WL are formed alternately to the word line contacts WC1 and WC2 as above, so that the number of the word line contacts WC does not increase. Moreover, the word line contact WC and the bit line contact BC corresponding to the second memory layer ML are formed on the formation positions of the word line contact WC and the bit line contact BC of the first memory layer ML, respectively.

In the nonvolatile memory device having such configuration, a voltage applied to the word lines WL and the bit lines BL is controlled so that a predetermined voltage is applied to a target memory cell MC, thereby changing a resistance state of the variable resistive element RW configuring the memory cell MC. Specifically, a process of causing current to flow in the variable resistive element RW in the low resistance state and returning to a high resistance state in which resistance is increased by one to two orders of magnitude by Joule heat is called a reset (erase) process and a process of returning to the low resistance state by applying a voltage to the variable resistive element in the high resistance state is called a set (write) process. In this manner, the high resistance state and the low resistance state are generated by the reset process and the set process to store resistance value information, and a current difference flowing in the memory cell MC is detected, thereby functioning as a memory.

Next, the manufacturing method of the nonvolatile memory device of such structure is explained. In the nonvolatile memory device again, a miniaturization technology used for a semiconductor device, specifically, a sidewall processing process can be applied, and the case is explained in which the sidewall processing process is applied for forming the memory cell array layer in the following. FIG. 3A to FIG. 17D are diagrams schematically illustrating an example of the manufacturing method of the nonvolatile memory device, in which FIG. 3A to FIG. 17A are plan views and FIG. 3B to FIG. 17B are A-A cross sectional views of FIG. 3A to FIG. 17A. FIG. 11C to FIG. 17C are B-B cross sectional views of FIG. 11A to FIG. 17A, and FIG. 16D to FIG. 17D are C-C cross sectional views of FIG. 16A to FIG. 17A.

First, an inter-layer dielectric film is formed above a semiconductor substrate such as a silicon substrate in which the peripheral circuit that includes the cell control transistor 12 formed of a CMOS (Complementary Metal-Oxide-Semiconductor) transistor or the like is formed and is flattened. Then, the memory layer including the word line contact and the bit line contact is formed on the flattened inter-layer dielectric film. In FIG. 3A to FIG. 17D, the semiconductor substrate, the peripheral circuit, and the inter-layer dielectric film formed above a lower layer side of the memory layer are not shown.

Figure 3A:
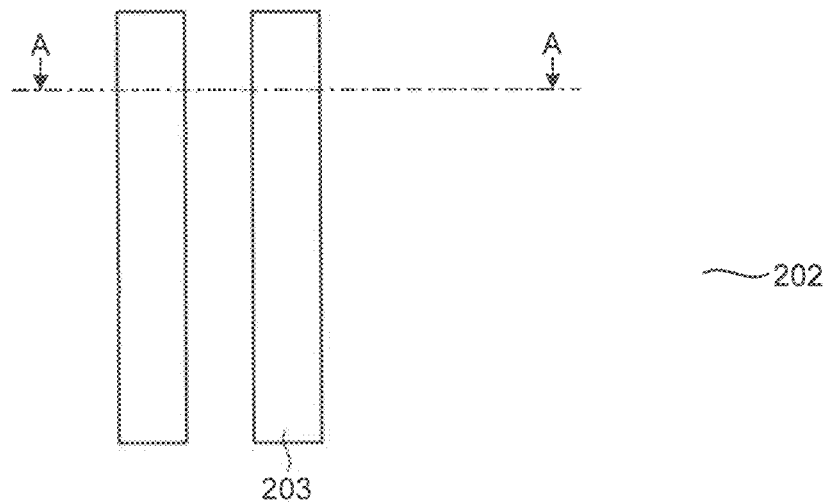
Figure 3B:
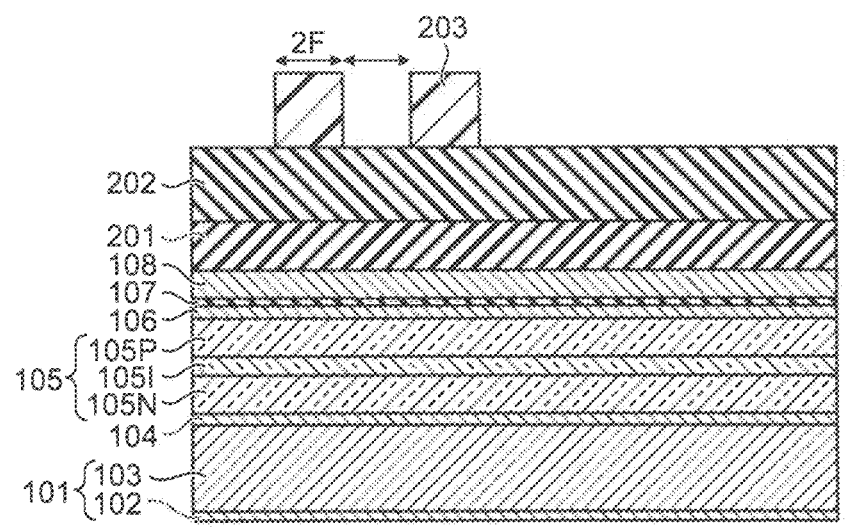

Next, as shown in FIG. 3A and FIG. 3B, a wire material layer 101 to be the word line WL1, a barrier metal film 104 such as TiN with a thickness of, for example, 5 nm, a rectifying layer 105 that controls a direction of current that flows in the memory cell MC, a barrier metal film 106 such as Ti/TiN with a thickness of, for example, 5 nm, a variable resistive layer 107 such as HfO with a thickness of, for example, 5 nm, and a cap film 108 such as W with a thickness of, for example, 50 nm, which functions as an upper portion electrode and as a stopper in the CMP (Chemical Mechanical Polishing) process, are formed in order on the not-shown flattened inter-layer dielectric film by a film forming method such as the PVD (Physical Vapor Deposition) method and the CVD (Chemical Vapor Deposition) method. The wire material layer 101 is composed of a stacked film of a barrier metal film 102 such as WNX with a thickness of, for example, 5 nm and a wiring layer 103 formed of W with a thickness of, for example, 50 nm. The rectifying layer 105 is composed of an amorphous Si or the like with a thickness of, for example, 100 nm, in which an N-type semiconductor film 105N, an I-type semiconductor film 105I, and a P-type semiconductor film 105P are stacked. This rectifying layer 105 functions as a non-ohmic element.

Moreover, on the cap film 108, a mask film 201 for wiring process such as SiN with a thickness of, for example, 100 nm and a core film 202 as a core in performing slimming in a subsequent process, which is formed of a TEOS (Tetraethoxysilane) film or the like with a thickness of, for example, 100 nm, are formed by the film forming method such as the CVD method. Then, a resist 203 is applied to the core film 202, and patterning is performed on the resist 203 by the lithography technology to form patterns for wire formation having a pitch that is twice of the memory cell to be finally formed on the memory layer. When a final target dimension is a half pitch F (for example, 20 nm), the width of the pattern for wire formation of the resist 203 is set to 2F (40 nm). The patterns for wire formation formed in a memory-cell forming region are a line and space pattern in the X direction.

Figure 4A:
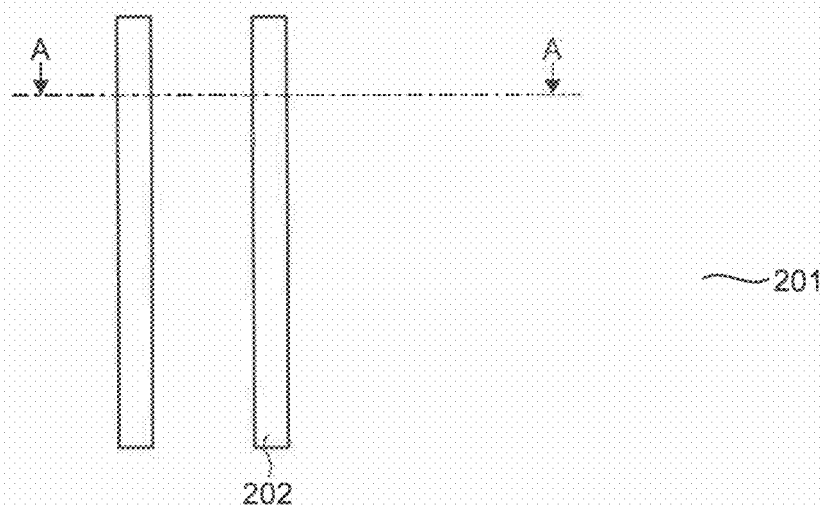
Figure 4B:
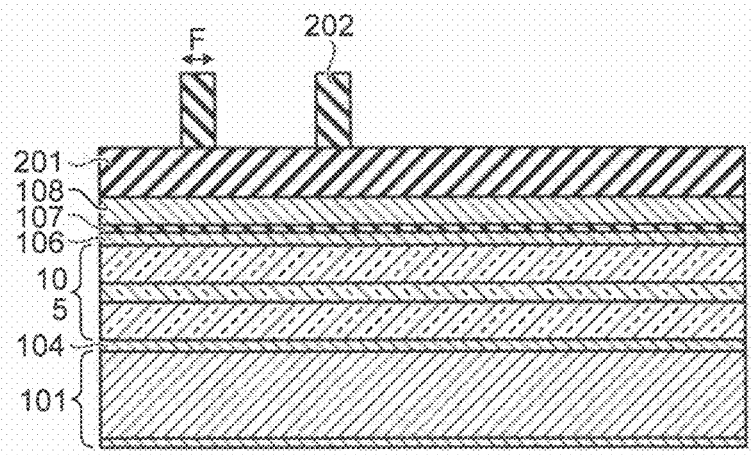

Next, as shown in FIG. 4A and FIG. 4B, the core film 202 is processed with the resist 203 as a mask by an anisotropic etching such as the RIE (Reactive Ion Etching) method to form the patterns for wire formation. The half pitch of the pattern for wire formation at this time is 2F. Thereafter, the pattern for wire formation is slimmed by a wet etching, so that the half pitch (wire width) of the pattern for wire formation becomes F. As the wet etching process, for example, an HF-based wet etching process by ammonium fluoride or the like can be performed.

Figure 5A:
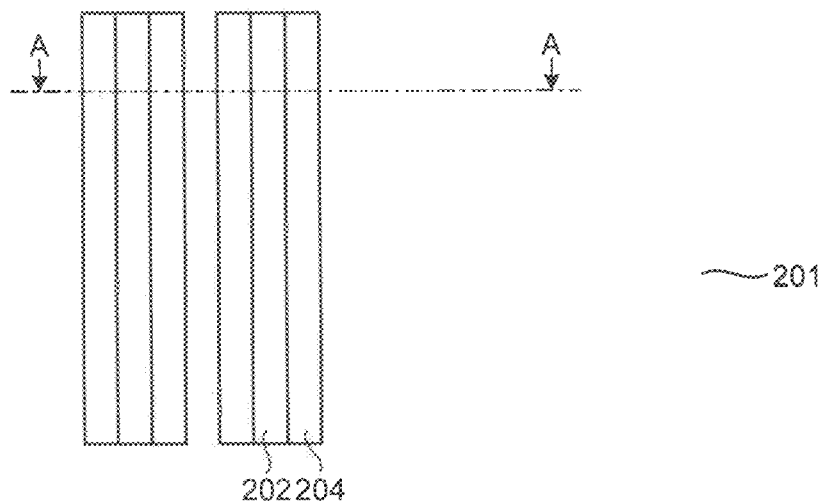
Figure 5B:
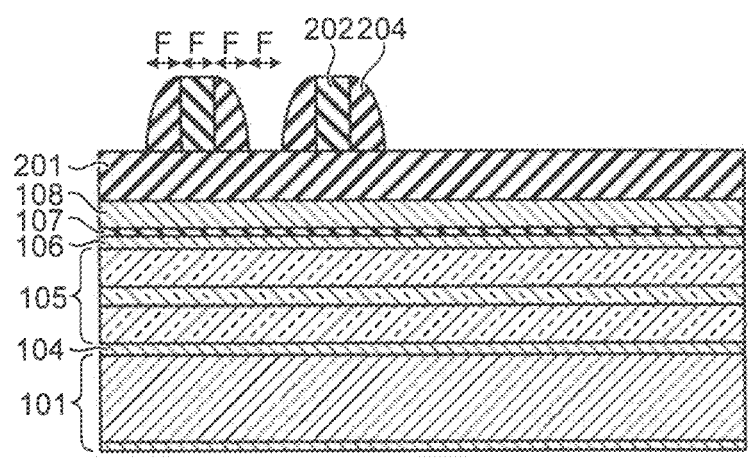

Next, as shown in FIG. 5A and FIG. 5B, on the mask film 201 on which the patterns for wire formation are formed, a spacer film 204 such as amorphous silicon is formed to have a thickness of the half pitch F by the film forming method such as the CVD method. Thereafter, etch back is performed to remove the spacer film 204 formed on the upper surfaces of the core film 202 and the mask film 201. Consequently, the spacer film 204 having a width (for example, 20 nm) of the half pitch F is formed into a ring shape (loop shape) surrounding the side surface of the core film 202.

Figure 6A:
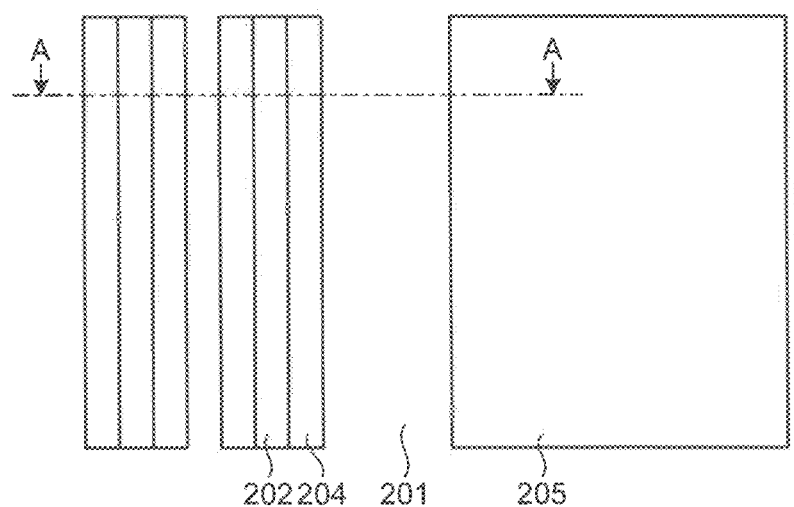
Figure 6B:
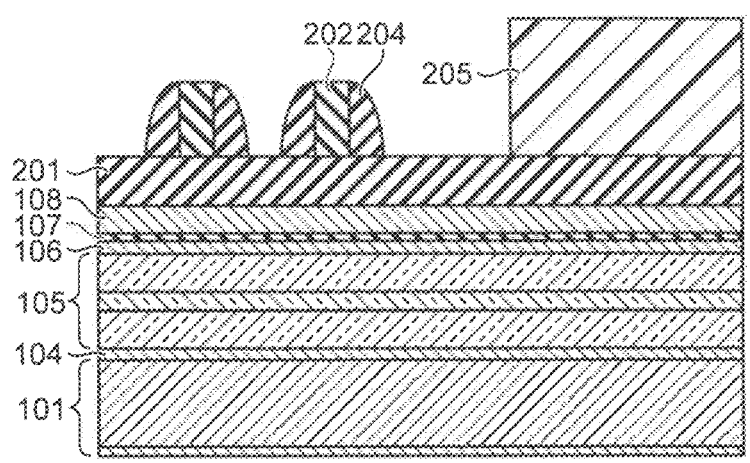
Figure 7A:
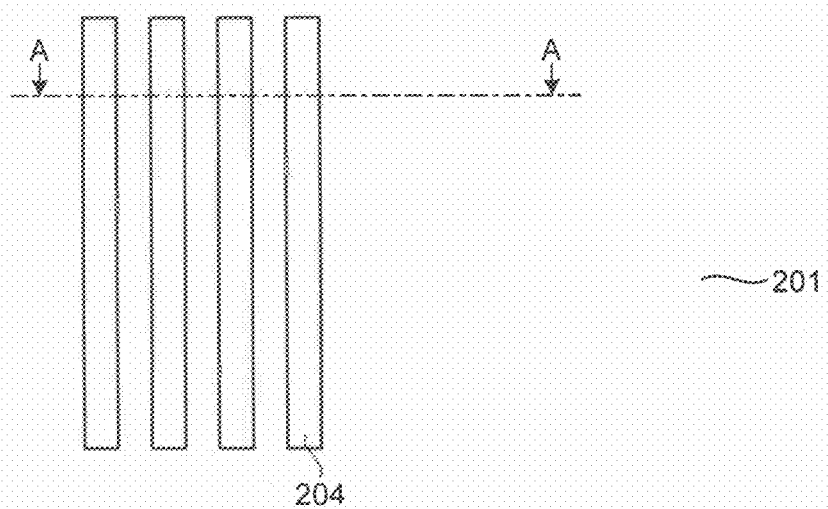
Figure 7B:
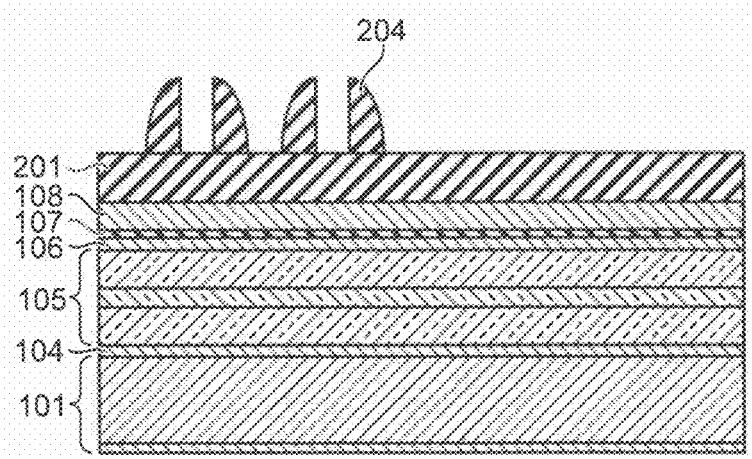

Next, as shown in FIG. 6A and FIG. 6B, after forming a resist 205 in a region including a not-shown word-line-contact forming region by the lithography technology, as shown in FIG. 7A and FIG. 7B, the core film 202 in a resist opening region is removed by the wet etching process in which the resist 205 is used as a mask to leave only the spacer film 204. As the wet etching process, for example, the HF-based wet etching process can be performed. The shape patterned by the first formed resist 203 remains in the region covered by the resist 205, and the ring-shaped (loop-shaped) spacer film 204 remains only in the outer periphery of the pattern formed by using the first resist 203 in the exposed region.

Figure 8A:
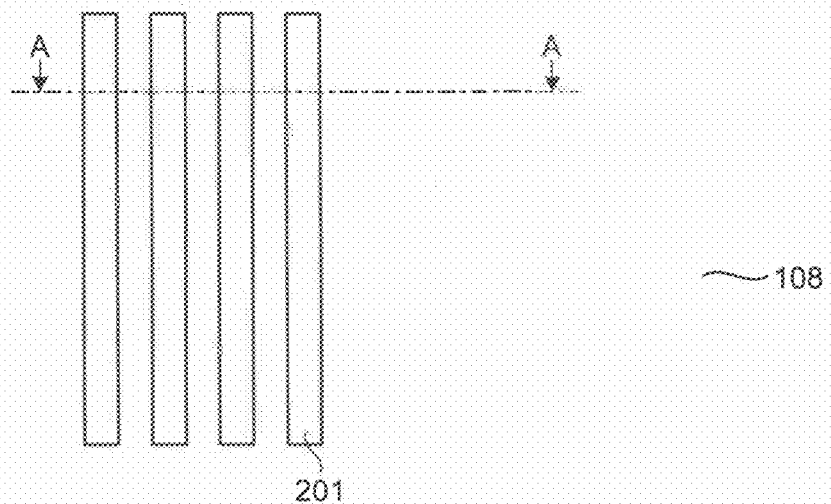
Figure 8B:
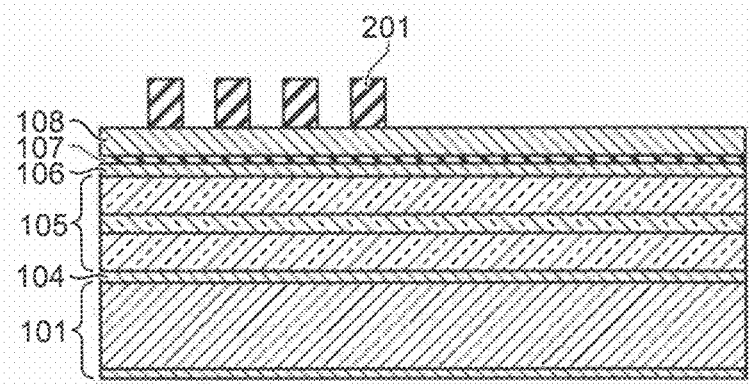

Next, as shown in FIG. 8A and FIG. 8B, after the resist 205 is removed, the mask film 201 is processed with the spacer film 204 and the not-shown core film 202 as a mask. Consequently, thin-line patterns for wire formation having a desired pitch are formed in the memory-cell forming region and thick-line patterns for wire formation are formed in the word-line-contact forming region and bit-line-contact forming region, separately. In this stage, the thin-line patterns for wire formation are all formed into a ring shape, so that an operation of dividing them into lines is performed. Although not shown here, after applying resist and patterning the resist so that, for example, the loop-shaped pattern for wire formation is open near both end portions in the word line direction (X direction) by the lithography technology, the mask film 201 is processed with this resist as a mask. Consequently, a line and space pattern having a desired pitch is formed.

Figure 9A:
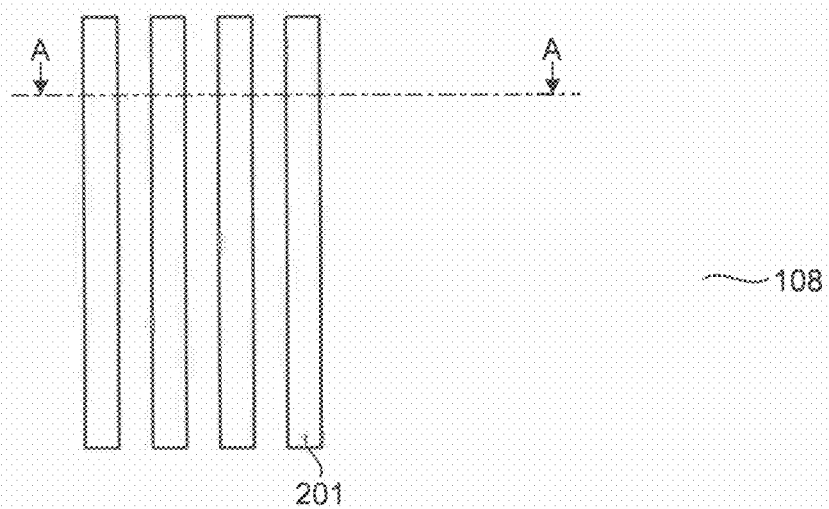
Figure 9B:
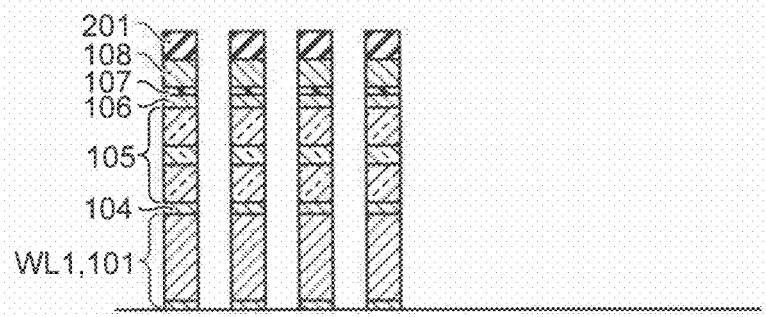
Figure 10A:
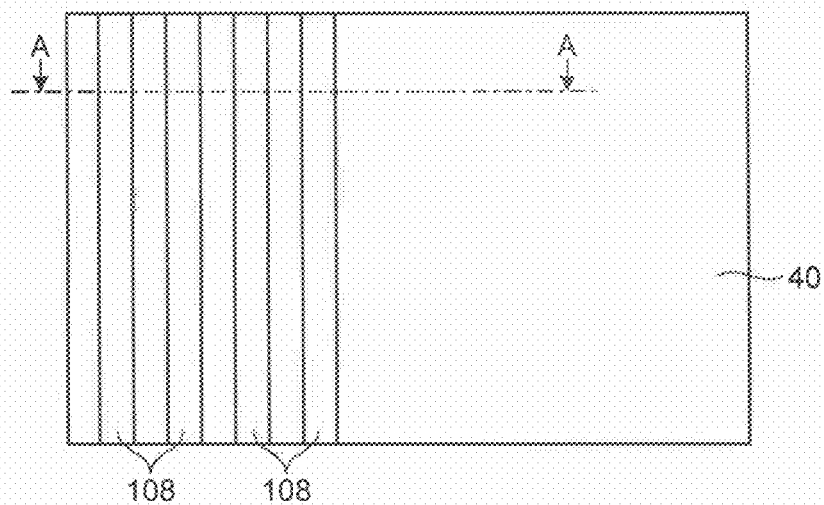
Figure 10B:
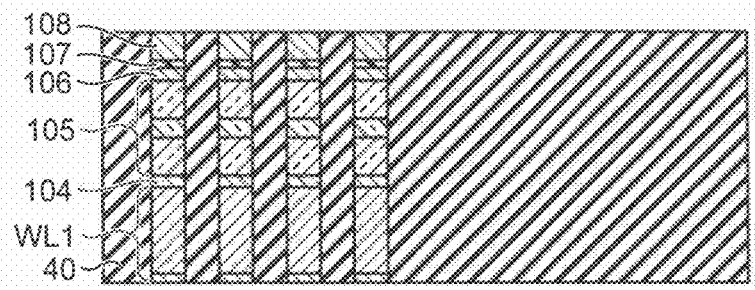

Next, as shown in FIG. 9A and FIG. 9B, layers from the cap film 108 to the wire material layer 101 are sequentially processed with the mask film 201 patterned into a desired shape as a mask. Consequently, in the memory-cell forming region, line and space shaped patterns that extend in the X direction are formed and the wire material layer 101 becomes the word line WL1. Next, as shown in FIG. 10A and FIG. 10B, a coating-type dielectric film such as polysilazane is embedded between the line and space shaped patterns to form the third inter-layer dielectric film 40. Thereafter, the third inter-layer dielectric film 40 is flattened by the CMP method with the cap film 108 as a stopper. Consequently, the upper surface of the cap film 108 is exposed.

Figure 11A:
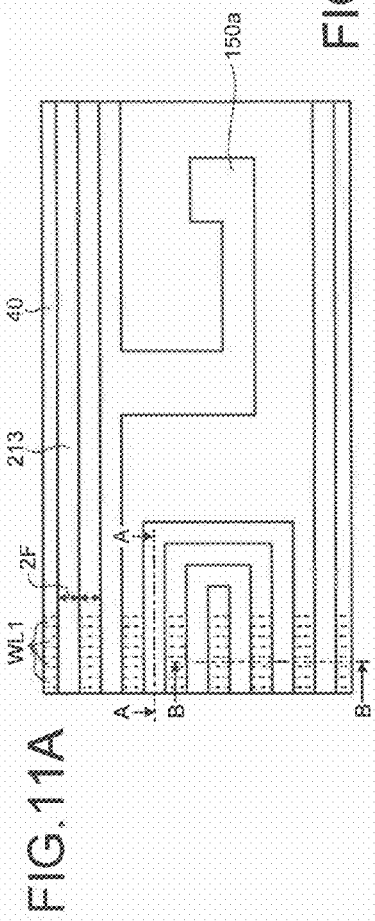
Figure 11C:
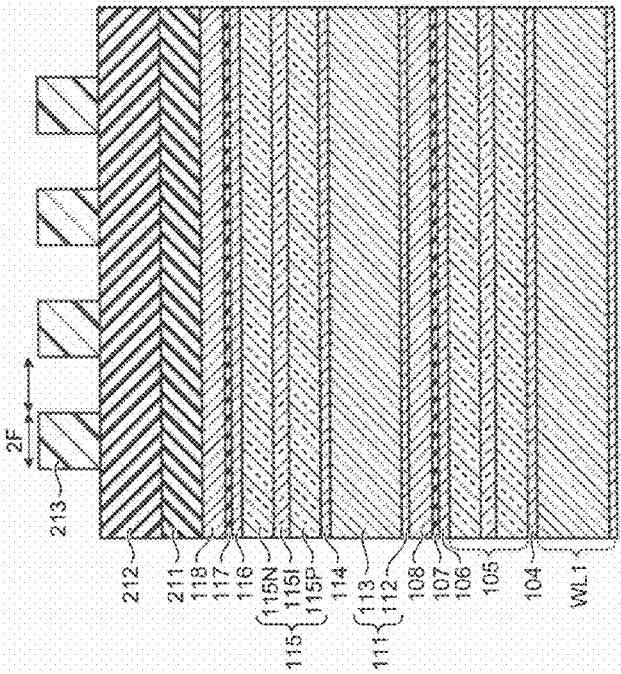
Figure 11B:
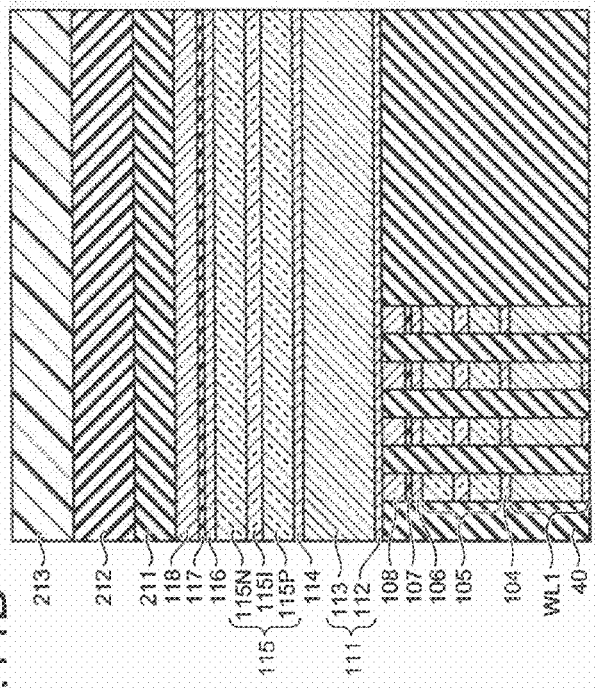

Next, as shown in FIG. 11A to FIG. 11C, on the third inter-layer dielectric film 40 in which the cap film 108 is exposed, a wire material layer 111 to be the bit line BL1 in which a barrier metal film 112 and a wiring layer 113 are stacked, a barrier metal film 114, a rectifying layer 115, a barrier metal film 116, a variable resistive layer 117, and a cap film 118 are formed in order by the film forming method such as the PVD method and the CDV method. These films can be formed, for example, with the material and the film thickness similar to the wire material layer 101 to the cap film 108 formed in the lower layer. In this example, because current is caused to flow in a direction from the bit line BL to the word line WL, the stacking order in the PIN structure of the rectifying layer 115 is opposite to the stacking order in the PIN structure of the rectifying layer 105 of the lower layer, and the rectifying layer 115 has a structure in which a P-type semiconductor film 115P, an I-type semiconductor film 115I, and an N-type semiconductor film 115N are stacked in order.

Moreover, a mask film 211 and a core film 212 are formed on the cap film 118 by the film forming method such as the CVD method. These films can also be formed, for example, with the material and the film thickness similar to the mask film 201 and the core film 202 formed in the lower layer. Then, a resist 213 is applied to the core film 212, and patterning is performed on the resist 213 by the lithography technology to form patterns for wire formation having a pitch that is twice of the memory element to be finally formed on the memory layer. The patterns for wire formation become a line and space pattern in a direction (Y direction) orthogonal to an extending direction (X direction) of the earlier-formed word line WL. Moreover, in the bit-line-contact forming region, a drawn-wire-portion forming pattern 150a is formed which is an approximately L-shaped pattern connected to the line and space pattern extending from the memory-cell forming region.

Figure 12A:
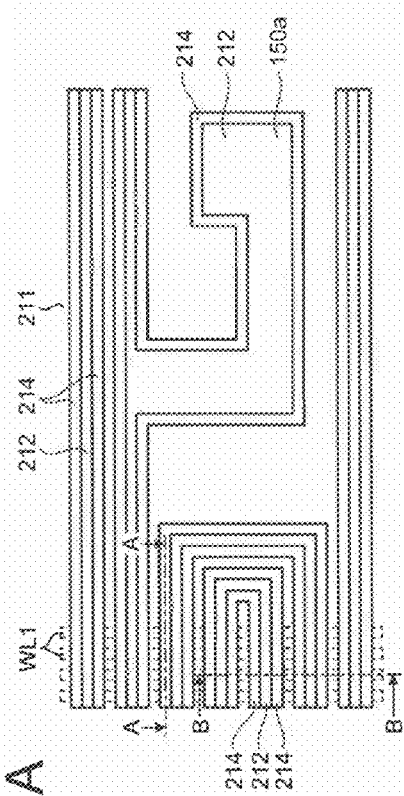
Figure 12C:
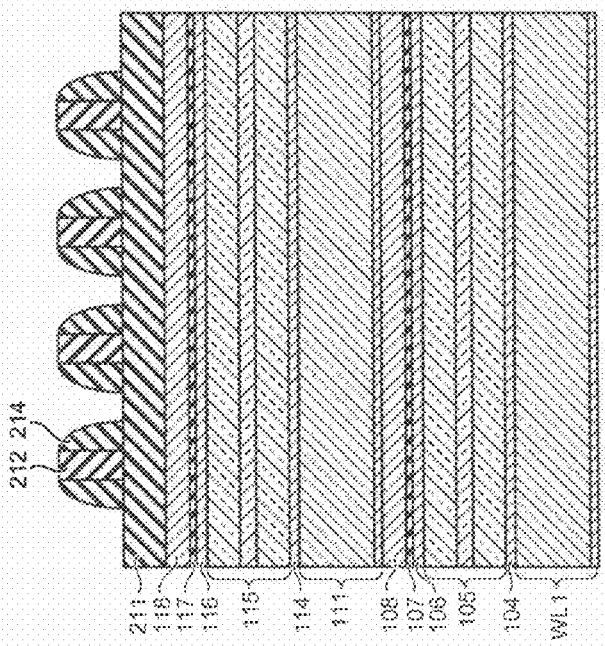
Figure 12B:
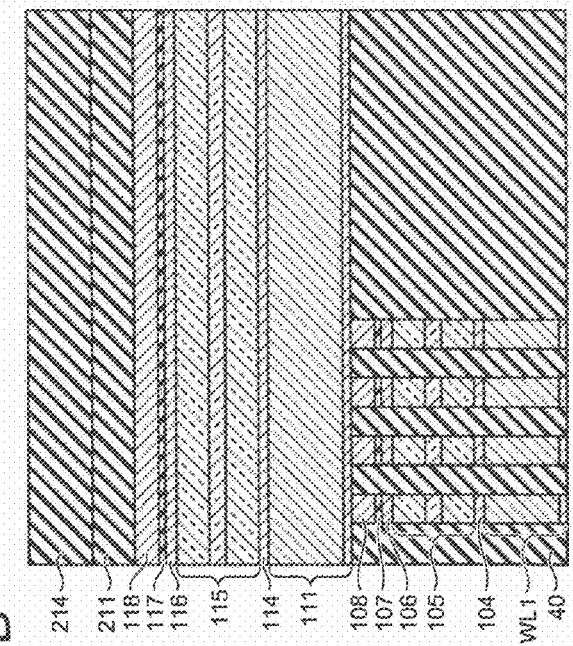

Next, after the core film 212 is processed by the anisotropic etching such as the RIE method with the resist 213 as a mask to form the patterns for wire formation whose half pitch (wire width) is 2F, the patterns for wire formation are slimmed so that the half pitch (wire width) becomes F. Thereafter, as shown in FIG. 12A to FIG. 12C, a spacer film 214 formed of amorphous silicon or the like is formed around the line and space shaped core film 212 to have a thickness equal to the half pitch F.

Figure 13A:
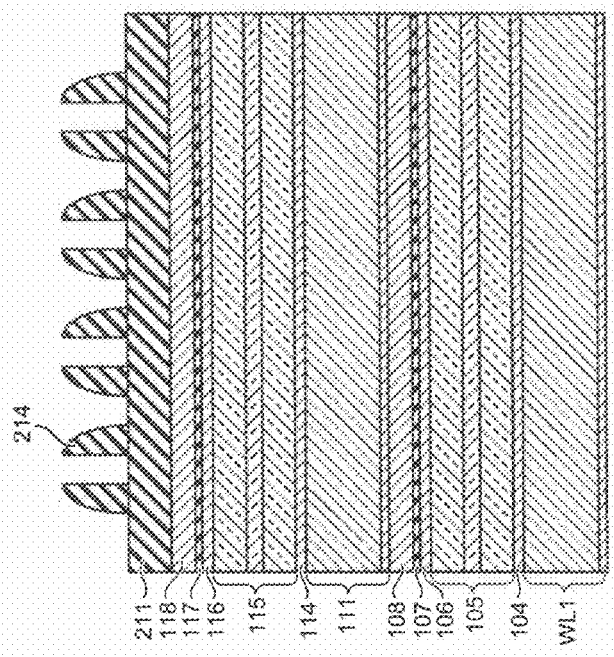
Figure 13B:
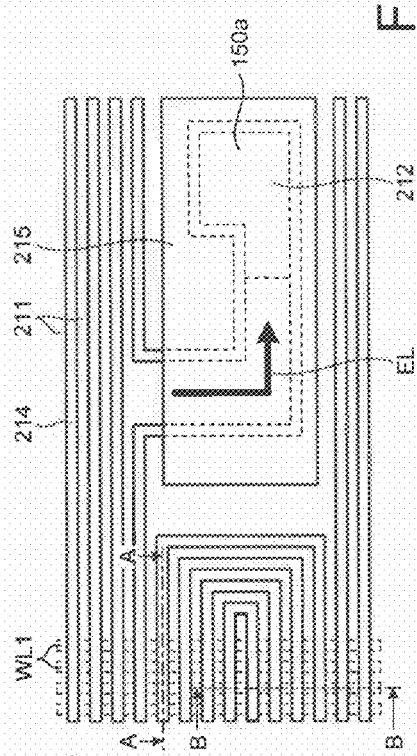
Figure 13C:
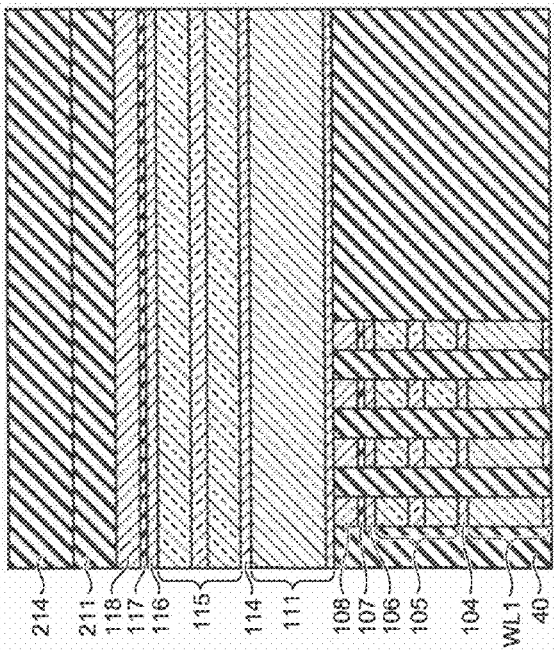

Thereafter, as shown in FIG. 13A to FIG. 13C, a resist 215 is formed in the bit-line-contact forming region, the core film 212 in a resist opening region is removed by the wet etching process in which the resist 215 is used as a mask to leave only the spacer film 214. As the wet etching process, for example, the HF-based wet etching process can be performed. At this time, because of the isotropic etching characteristics of an etching liquid EL, the etching liquid EL penetrates from a resist boundary formed in the bit-line-contact forming region and part of the core film 212 under the resist 215 is etched.

Figure 14C:
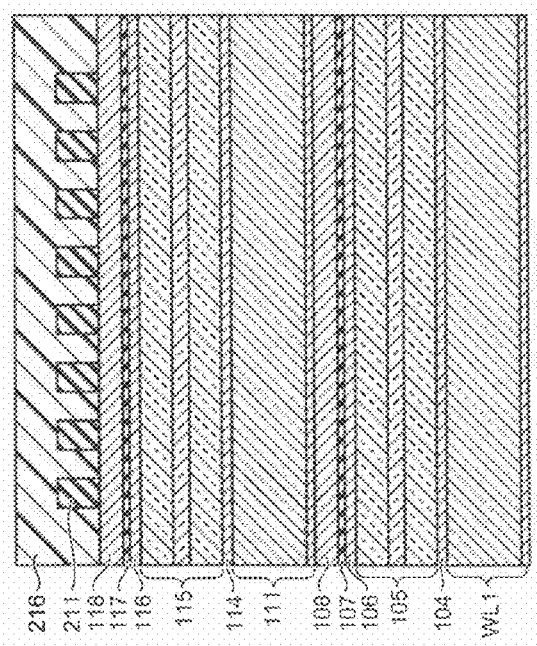
Figure 14A:
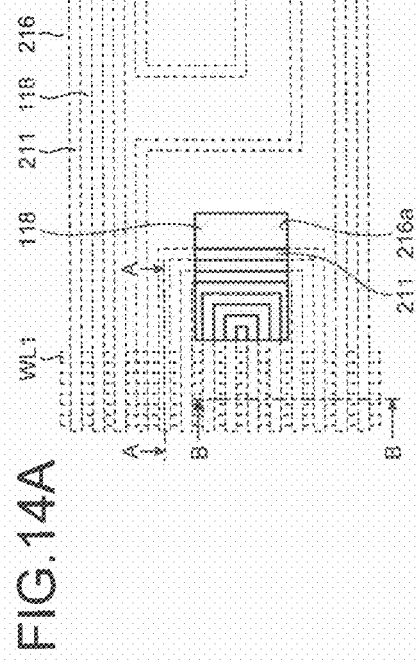
Figure 14B:
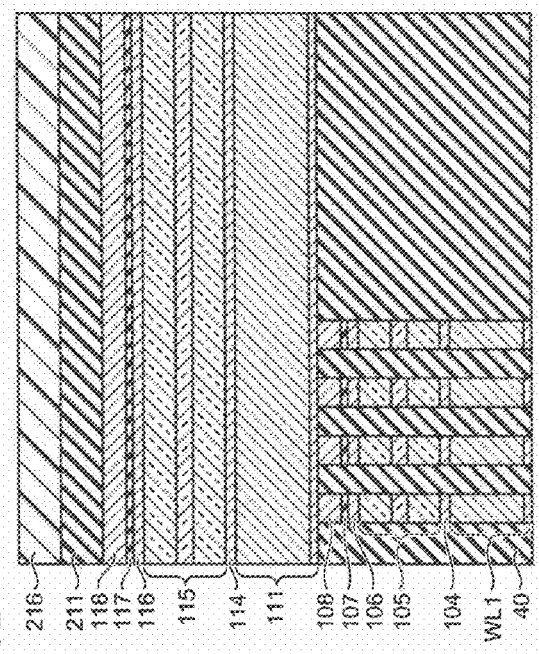
Figure 16A:
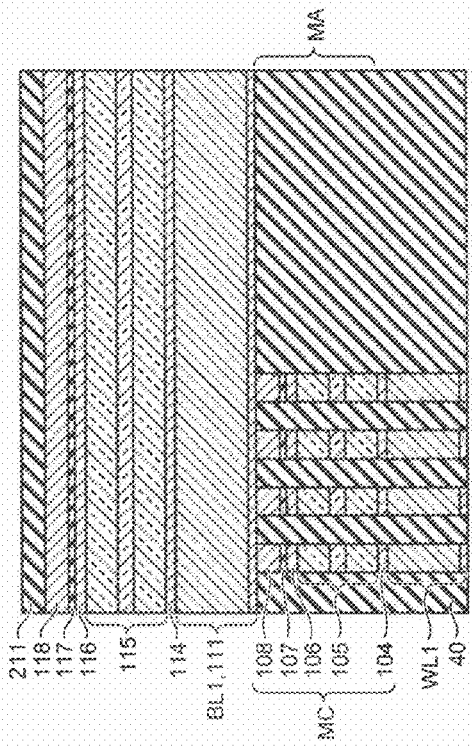
Figure 16B:
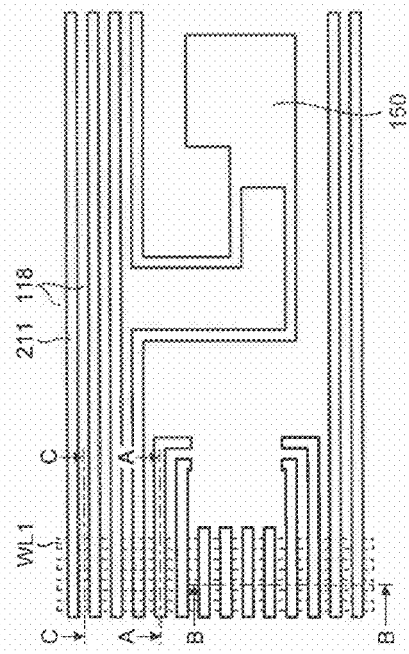
Figure 16C:
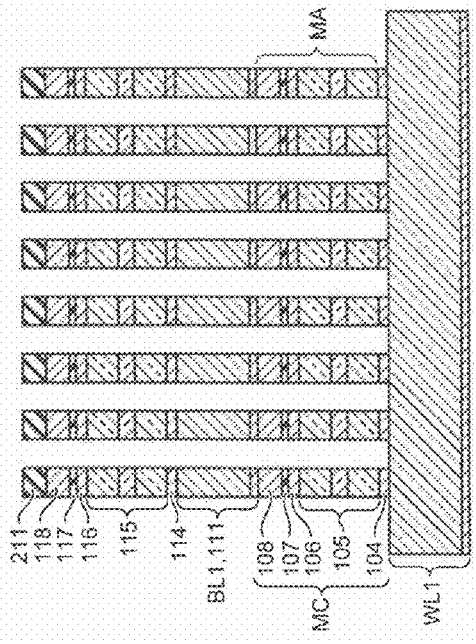
Figure 16D:
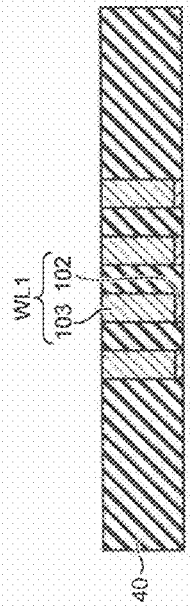
Figure 17A:
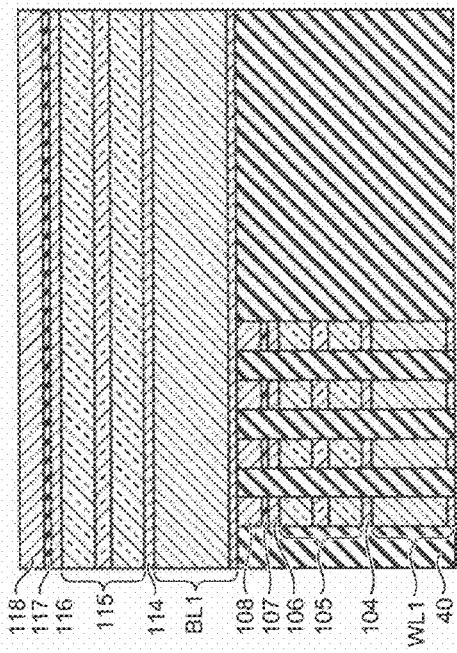
Figure 17C:
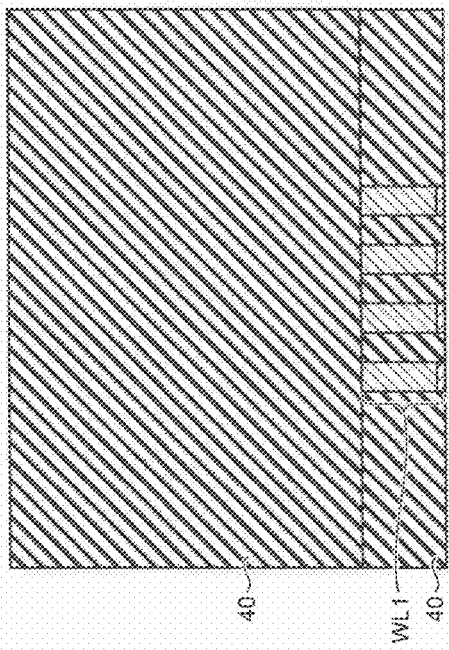
Figure 17B:
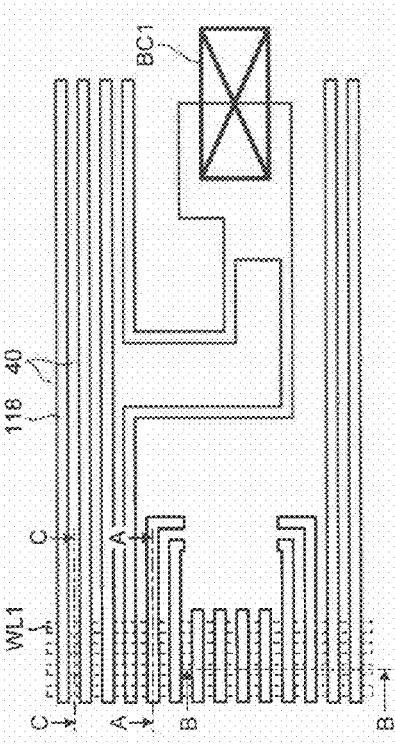
Figure 17D:
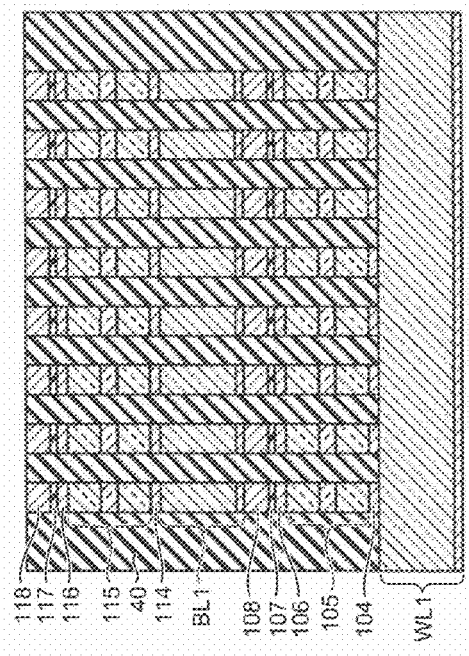

Next, as shown in FIG. 14A to FIG. 14C, after the resist 215 is removed, the mask film 211 is processed with the spacer film 214 and the core film 212 as a mask. Consequently, the patterns for wire formation having a wire width of a minimum pitch are formed in the memory-cell forming region (region that was not covered with the resist 215) in which a process mask is formed only by the spacer film 214 and the pattern for wire formation having a width wider than the minimum pitch is formed in the bit-line-contact forming region in which a mask is formed by the spacer film 214 and the core film 212.

At this time, in the similar manner to FIG. 8A and FIG. 8B, the pattern for wire formation having a minimum wire width that is formed with the spacer film 214 as a mask becomes a ring shape (loop shape), so that an operation is performed to divide two patterns for wire formation connected in a ring shape. Therefore, a resist 216 is applied to the cap film 118 on which the patterned mask film 211 is formed, and, for example, an opening 216a is formed only at a dividing portion such as near both end portions of the loop-shaped patterns for wire formation in the bit line direction (Y direction). Then, as shown in FIG. 15A to FIG. 15C, the mask film 211 is etched with the resist 216 as a mask. Thereafter, the resist 216 is removed.

Next, as shown in FIG. 16A to FIG. 16D, layers from the cap film 118 to the barrier metal film 104 are sequentially processed with the mask film 211 as a mask. Consequently, in the memory-cell forming region, a line and space shaped pattern having the minimum pitch that extends in the Y direction is formed. As a result, the wire material layer 111 becomes the bit line BL1 and the memory cell MC patterned into a pillar-shaped structure in which a stacked film from the barrier metal film 104 to the cap film 108 is defined by the width of the word line WL1 and the width of the bit line BL1 is formed between the word line WL1 and the bit line BL1. Moreover, in the bit-line-contact forming region, layers from the cap film 118 to the barrier metal film 104 are processed in accordance with the pattern of the mask film 211. Consequently, a first memory cell array layer MA is formed. Moreover, in the word-line-contact forming region and the bit-line-contact forming region, a pad-shaped drawn wire portion 150 is formed.

Thereafter, as shown in FIG. 17A to FIG. 17D, a coating-type dielectric film such as polysilazane is embedded between the line and space shaped patterns to form the third inter-layer dielectric film 40. Then, the third inter-layer dielectric film 40 is flattened by the CMP method with the cap film 118 as a stopper. Consequently, the upper surface of the cap film 118 is exposed.

Thereafter, the procedure similar to the above method is repeated to form second to fourth memory cell array layers MA. After the fourth memory cell array layer MA is formed, a contact hole is formed which communicates with the formation position of the landing pad WL1p in the word-line-contact forming region and the bit-line-contact forming region by the lithography technology and the etching technology. At this time, as shown in FIG. 1A, the word line WL2 covers part of the contact-hole formation position of the word line contact WC2, so that the contact hole is formed in a portion excluding the formation region of the word line WL2 from the contact hole of the word line contact WC2 in a depth equal to or lower than the word line WL2. The contact holes are formed in the bit line contacts BC1 and BC2 in FIG. 1B in the similar manner. Then, after forming a barrier metal film such as TiN with a thickness of, for example, 10 nm on the inner surface of the contact holes of the word line contacts WC1 and WC2 and the bit line contacts BC1 and BC2, and moreover, filling a conductive material such as W, the barrier metal film and the conductive material formed above the third inter-layer dielectric film 40 are removed by the CMP method or the like to be flattened. Thereafter, the word line (WL3) that is the top layer wire is formed on the third inter-layer dielectric film 40 and the landing pad WL3p is formed with Al or the like on the formation positions of the word line contacts WC1 and WC2 and the bit line contacts BC1 and BC2, thereby completing the nonvolatile memory device shown in FIG. 1A and FIG. 1B.

Figure 18:
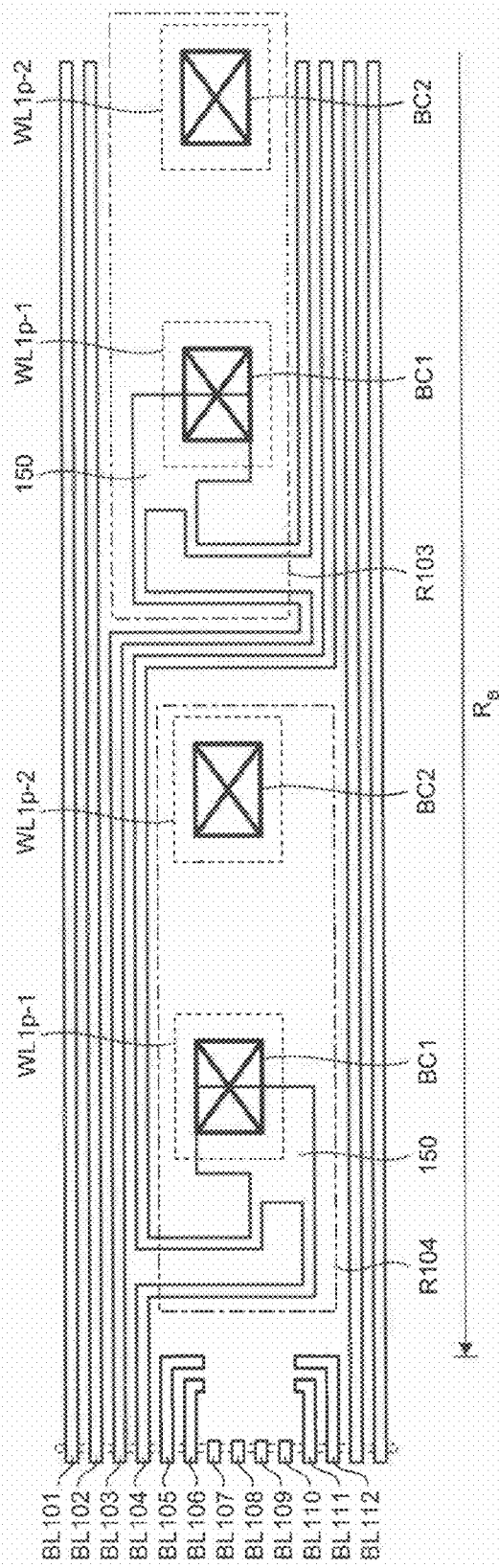
FIG. 18 is a partial top view schematically illustrating an example of a bit-line-contact forming region of the nonvolatile memory device.

FIG. 18 is a partial top view schematically illustrating an example of the bit-line-contact forming regions of the nonvolatile memory device. FIG. 18 illustrates an example of the bit-line-contact forming regions RB on the plane (wiring layer) on which the bit lines BL1 are formed. As shown in FIG. 18, the drawn wire portion 150 connected to a bit line BL104 is formed in a bit-line-contact forming region R104, and the drawn wire portion 150 connected to a bit line BL103 is formed in a bit-line-contact forming region R103. As described above, two bit line contacts BC1 and BC2 are formed in one bit-line-contact forming region RB, and bottom portions of the bit line contacts BC1 and BC2 are connected to landing pads WL1p-1 and WL1p-2. The drawn wire portion 150 connected to the bit line contact BC1 is formed to position on the landing pad WL1p-1. Moreover, although not shown, an approximately L-shaped drawn wire portion 150 is formed to be arranged at the formation position of the bit line contact BC2 in the upper layer in which the bit line BL2 is formed in the similar manner.

Although not shown here, the bit-line-contact forming regions RB of bit lines BL101 and BL102 are provided in a not-shown region that extends in a right direction in the paper surface beyond a bit-line-contact forming region R103. Moreover, the bit-line-contact forming regions RB of bit lines BL105 to BL112 are provided in a not-shown region in a left direction in the paper surface beyond the memory-cell forming region. In this manner, the bit-line-contact forming region RB is provided alternately in the right and left direction with respect to the memory-cell forming region with a predetermined number of the bit lines BL as a unit. In FIG. 4, the bit-line-contact forming region RB is explained, however, the word-line-contact forming region RW has an approximately the same structure.

In the above manufacturing method of the nonvolatile memory device, exposure needs to be performed three times for forming one layer of wiring in the following processes.

(1) typical forming process of a resist pattern (2) process of separately forming a line formed with a minimum half pitch in the memory-cell forming region and a pattern wider than the minimum half pitch in the word-line-contact forming region RW, the bit-line-contact forming region RB, and the like (3) process of dividing a pattern that is formed into a loop shape (ring shape)

Specially, in the three-dimensional cross-point type memory, the number of times of exposure is tripled for the number of layers to be formed, so that a problem arises in that the process cost increases.

Moreover, as explained in FIG. 13A to FIG. 13C, in separately forming a pattern between the memory-cell forming region and the bit-line-contact forming region RB and the like therearound, when the core film 212 is selectively removed by the wet etching process, there is a problem in that part of the core film 212 covered with the resist 215 in the bit-line-contact forming region is also etched. Therefore, the dimension of the drawn wire portion 150 in the bit line direction (Y direction) needs to be extended excessively by about 0.3 to 0.4 for avoiding removal of the whole core film 212 forming the drawn wire portion 150.

Furthermore, as shown in FIG. 1A, FIG. 1B, or FIG. 18, in the three-dimensional cross-point type nonvolatile memory device, the word line contacts WC1 and WC2 are arranged to be aligned approximately on the extended line of the word lines WL1 to WL3 to be connected, and the bit line contacts BC1 and BC2 are also arranged to be aligned approximately on the extended line of the bit lines BL1 and BL2 to be connected. FIG. 1A and FIG. 1B illustrate the case where only two layers of the bit lines BL are formed in the height direction when four memory cell array layers MA are formed. When the memory cell array layer MA is further stacked, the number of the bit lines BL increases and the number of the bit line contacts BC also increases corresponding thereto. In this case, the bit line contact BC is formed by the number of the bit lines BL stacked in the height direction in the right and left direction in the bit-line-contact forming region RB (for example, bit-line-contact forming regions R103 and R104) in FIG. 18. In this manner, when the number of the stacked memory cell array layers MA increases, the bit line contact BC needs to be ensured by the number of the layers of the bit lines BL included therein, so that the area of the bit-line-contact forming region RB increases by that amount. The increase of the area occurs in all of the bit-line-contact forming regions RB, so that the memory cell area increases largely in the whole nonvolatile memory device.

Moreover, in the three-dimensional cross-point type nonvolatile memory device such as a resistance change memory, the structure is such that the memory cell array is divided into small sizes compared to the NAND-type flash memory and the drawn portion is provided to each divided memory cell array to be driven separately. In the resistance change memory, the structure is such that the variable resistive element and the rectifying element are connected in series, so that if many memory cells MC are connected to one wire, leakage current as a total of off-leakage currents of the rectifying elements increases even in the state where a reverse voltage is applied to the rectifying elements. In order to prevent increase of this leakage current, the memory cell array is divided into small sizes as described above. In other words, in the resistance change memory, the number of the drawn wire portions 150 present is proportional to "number of stacked wires □ number of divisions of memory cell array", so that even if the length of one portion of the word line contact WC or the bit line contact BC is increased by about 0.3 □m in the word line direction or the bit line direction, the area increases significantly as a whole, so that impact on the chip area is large and the cost increase arises as a problem. Moreover, when the number of the drawn wire portions 150 increases, a dummy region arrangement for preventing dishing in the CMP process is needed, which results in further increase of a ratio of the word-line-contact forming region RW and the bit-line-contact forming region RB with respect to the memory-cell forming region.

Explanation is given for the nonvolatile memory device and the manufacturing method thereof in which when forming wires of the memory cell array layer MA with the minimum half pitch by using the sidewall processing process, a connection region (contact forming region) of a wire extending from the memory cell MC and a driver can be reduced compared to the conventional technology. Moreover, explanation is also given for the manufacturing method of the nonvolatile memory device capable of reducing the number of times of exposure compared to the conventional technology.

(First Embodiment)

Figure 19A:
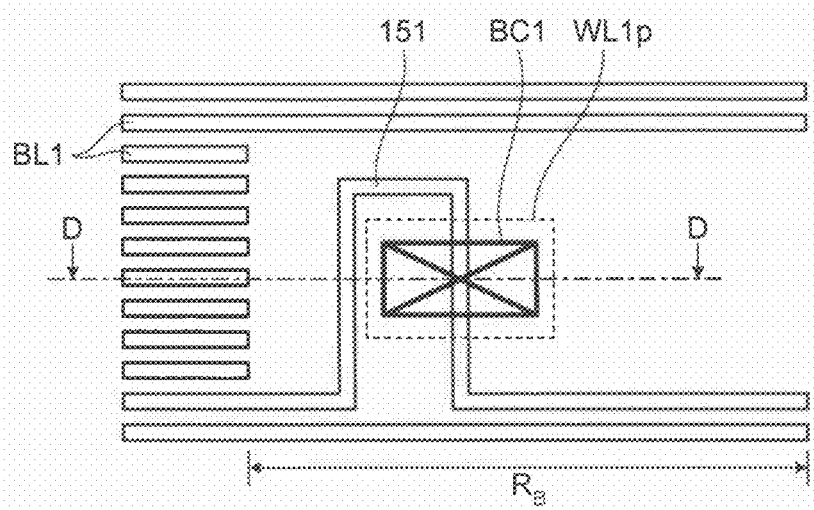
FIG. 19A and FIG. 19B are diagrams schematically illustrating a state of a contact portion of the nonvolatile memory device in a first embodiment.
Figure 19B:
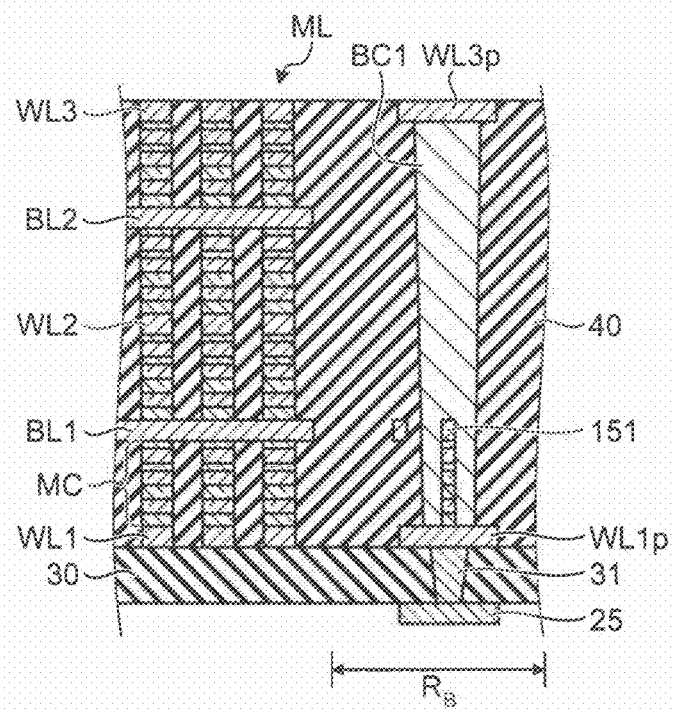

FIG. 19A and FIG. 19B are diagrams schematically illustrating a state of a contact portion of the nonvolatile memory device in the first embodiment, in which FIG. 19A is a plan view at a position at which the bit lines BL1 are formed and FIG. 19B is a D-D cross-sectional view of FIG. 19A. FIG. 19A and FIG. 19B illustrate only one bit line contact BC1 for convenience sake of explanation. Moreover, the configuration of the memory layer of this nonvolatile memory device is similar to that shown in FIG. 1A and FIG. 1B, so that explanation thereof is omitted. Furthermore, a contact plug in claims corresponds to the word line contact WC and the bit line contact BC.

As described above, in the memory cell array layer MA, wires are formed with the minimum half pitch, and the word line WL and the bit line BL connected to each memory cell MC of the memory cell array layer MA are formed to extend to the word-line-contact forming region and the bit-line-contact forming region to be connected to corresponding drivers, respectively. In the first embodiment, as shown in FIG. 19A, the bit line BL1 has a structure to be formed with a width of the minimum half pitch up to the bit-line-contact forming region RB. Moreover, as shown in FIG. 19B, the bit line contact BC1 is provided straddling a drawn wire portion 151 having a width of the minimum half pitch. In other words, in the bit-line-contact forming region RB, the drawn wire portion 151 has a structure to be connected to the bit line contact BC on the upper surface and the both side surfaces thereof. In this example, the landing pads WL1p and WL3p corresponding to the bottom layer wire (the word line WL1) and the top layer wire (the word line WL3) have a structure similar to those in the above typical method. Moreover, in this example, the bit line contact BC1 is explained, however, the drawn wire portion and the word line contact in the word-line-contact forming region also have the similar structure.

Figure 20A:
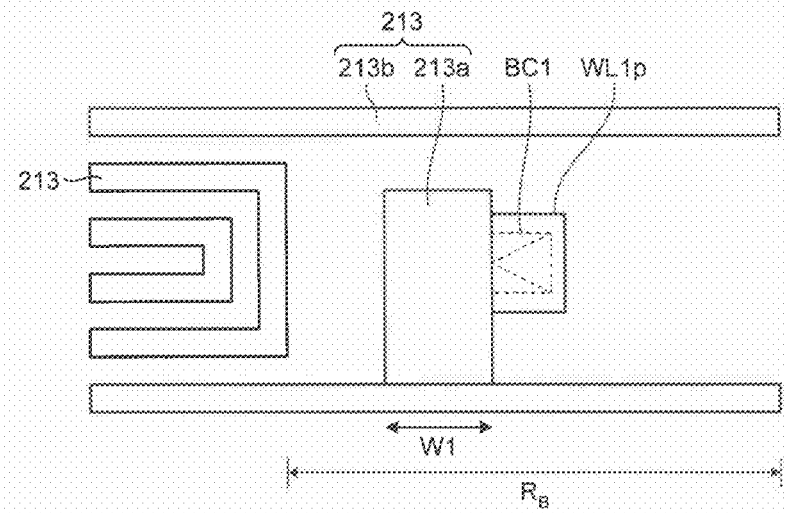
FIG. 20A to FIG. 20C are plan views schematically illustrating an example of a procedure of the manufacturing method of the nonvolatile memory device in the first embodiment.
Figure 20B:
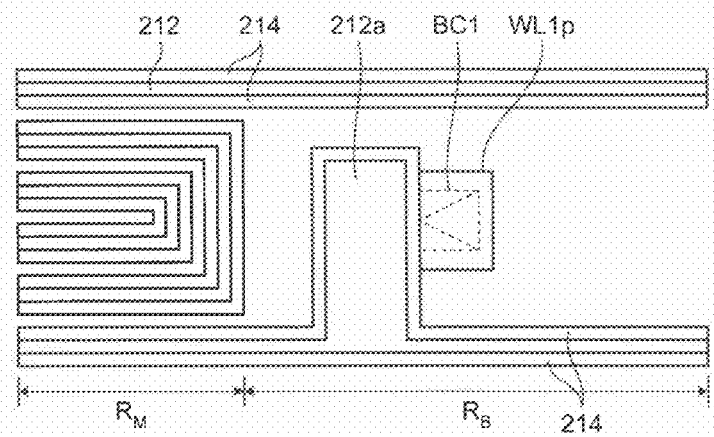
Figure 20C:
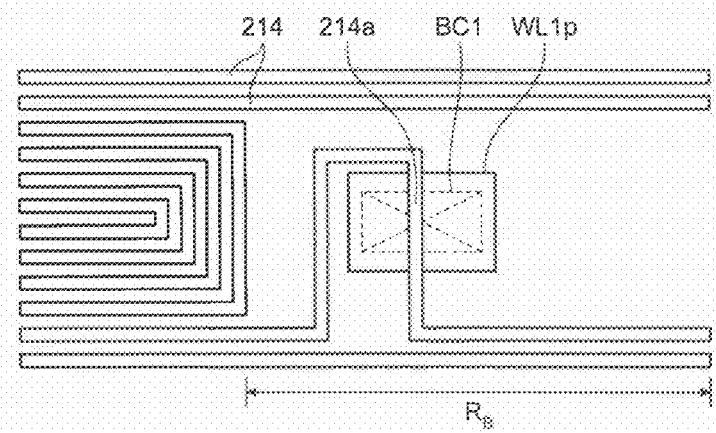
Figure 21:
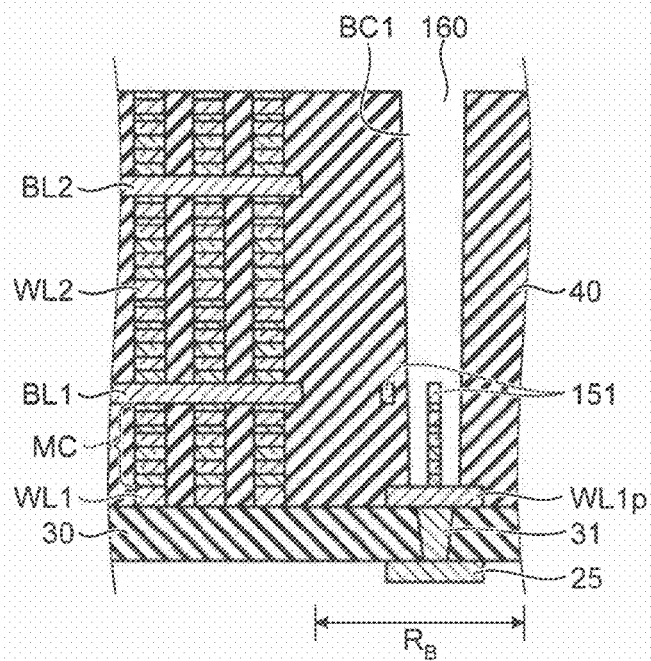
FIG. 21 is a cross-sectional view schematically illustrating an example of a procedure of the manufacturing method of the nonvolatile memory device in the first embodiment.

FIG. 20A to FIG. 20C are plan views schematically illustrating an example of a procedure of the manufacturing method of the nonvolatile memory device in the first embodiment, and FIG. 21 is a cross-sectional view schematically illustrating an example of a procedure of the manufacturing method of the nonvolatile memory device in the first embodiment. In this example, only a portion different from the manufacturing method of the nonvolatile memory device explained in FIG. 3A to FIG. 17D is explained. Moreover, in this example, a forming method of the bit line contact is explained, however, a forming method of the word line contact is similar.

When patterning the resist 213 to form the patterns for wire formation, in the above typical method, as shown in FIG. 11A, the L-shaped pattern 150a is formed as the pattern for drawn wire formation in the bit-line-contact forming region RB to be connected to each pattern for bit line formation. However, in the first embodiment, as shown in FIG. 20A, a rectangular pattern 213a is formed to be connected to each bit-line forming pattern 213b. This rectangular pattern 213a is formed to cover part of the landing pad WLp1 formed at the height at which the word line WL1 is formed.

Figure 22:
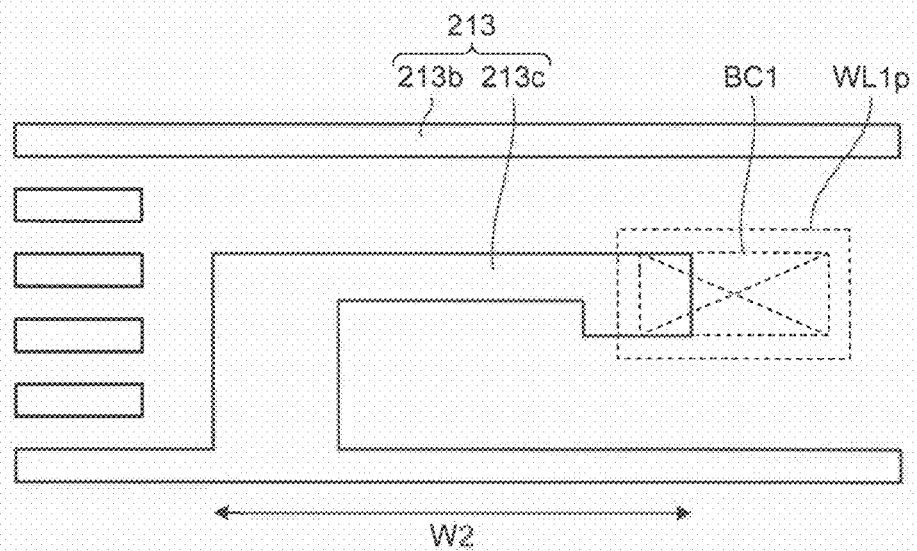
FIG. 22 illustrates a pattern of the bit-line-contact forming region by a typical method.

FIG. 22 illustrates a pattern of the bit-line-contact forming region by a typical method. As explained in FIG. 13A to 13C, in the typical method, in the subsequent removing process of the core film 212 by the wet etching, because part of a portion covered with the resist 213 is also removed, a pattern 213c in which excess dimension is added in the bit line BL direction is formed so that the portion is not completely removed in the etching process time. Compared to a width W2 in the bit line BL direction necessary for forming this drawn wire portion, in the first embodiment shown in FIG. 20A, a width W1 in the bit line BL direction is significantly reduced. This is because, in the first embodiment, the drawn wire portion 151 is configured to have the same wire width as the word line WL and the bit line BL and the drawn wire portion 151 is only arranged across the landing pad WL1p.

Next, the core film 212 is etched by using the resist 213 in which the patterns are formed, and is slimmed so that the width of the pattern for wire formation in a memory-cell forming region RM becomes a target half pitch. Thereafter, the spacer film 214 is formed around the core film 212. At this time, as shown in FIG. 20B, the spacer film 214 is formed also around a core film 212a of the wire drawn portion so that the thickness (width) becomes the minimum half pitch.

Thereafter, as shown in FIG. 20C, the core film 212 is removed by the wet etching process to leave only the spacer film 214. At this time, the spacer film 214 with the minimum half pitch is left along the periphery of the core film 212a that is processed into a rectangular shape, near the formation position of the bit line contact BC1. Then, one pattern 214a of the two patterns orthogonal to the bit line BL direction is formed across the formation position of the landing pad WL1p formed in the lower layer. In this manner, the patterns for wire formation are formed.

In the typical method, as shown in FIG. 13A to FIG. 13C, the exposure process is performed to leave the resist 215 on the formation position of the drawn wire portion 150, however, in the first embodiment, the core film 212a of the drawn wire portion is all removed, so that there is no need to perform a process of forming a resist and exposing the resist.

Thereafter, a process similar to the process illustrated in FIG. 14A to FIG. 14C and the following drawings is performed. Specifically, after performing a process of processing the mask film 211 with the spacer film 214 as a mask and dividing the patterns for wire formation formed into a ring shape (loop shape) in the memory-cell forming region RM into the bit lines BL, layers from the cap film 118 to the barrier metal film 104 are sequentially processed with the mask film 211 as a mask. Next, the third inter-layer dielectric film 40 is embedded between line and space shaped patterns, and is flattened by the CMP method with the cap film 118 as a stopper. Thereafter, the similar process is repeated to form four memory cell array layers MA.

Next, as shown in FIG. 21, a contact hole 160 is formed which communicates with the formation position of the landing pad WL1p in the bit-line-contact forming region RB (word-line-contact forming region) by the lithography technology and the etching technology. At the formation position of the contact hole 160 of the bit line contact BC1, part of the drawn wire portion 151 connected to the bit line BL1 is formed across approximately the center of the landing pad WL1p in the bit line BL1 direction in a direction vertical to the bit line BL1. Therefore, the contact hole 160 in the depth equal to or lower than this bit line BL1 is a portion excluding a region overlapping the drawn wire portion 151 from the contact hole 160 at the position higher than the bit line BL1. Then, a barrier metal film or a conductive material is filled in the inner surface side of the contact hole 160 to form the bit line contact BC1. Other word line contacts WC1 and WC2, bit line contact BC2, and the like are formed in the similar manner. Thereafter, the word line (WL3) that is the top layer wire is formed on the third inter-layer dielectric film 40 and the landing pad WL3p is formed with Al or the like on the formation positions of the word line contacts WC1 and WC2 and the bit line contacts BC1 and BC2, thereby completing the nonvolatile memory device shown in FIG. 19A and FIG. 19B.

In the first embodiment, the word line WL and the bit line BL connected to the memory cell MC are extended to the word-line-contact forming region and the bit-line-contact forming region while keeping a width of the minimum half pitch to form the drawn wire portion 151, and the word line contact WC and the bit line contact BC are formed straddling this drawn wire portion 151. Consequently, the formation area of the drawn wire portion 151 can be made small compared to the case of processing the drawn wire portion 150 into a pad shape. In other words, the core film 212 does not need to be left at the pattern formation of the drawn wire portion 151, so that there is no need to increase the dimension taking into consideration the removal of the core film 212 of the drawn wire portion 150 by the etching liquid in the removing process of the core film 212. As a result, an effect is obtained that the formation area of the drawn wire portion 151 can be reduced and the whole area of the memory cell of the nonvolatile memory device can be reduced. Moreover, the core film 212 does not need to be left at the pattern formation of the drawn wire portion 151, so that a mask does not need to be formed on the drawn wire portion 151 at the removal of the core film 212 and thus an effect is obtained that the lithography process can be reduced compared to the typical method.

(Second Embodiment)

In the first embodiment, for example, as shown in FIG. 19A and FIG. 19B, for the top and bottom wires in the memory layer, i.e., the word lines WL1 and WL3, the landing pads WL1p and WL3p are formed by the method illustrated in FIG. 3A to FIG. 17D at the formation position of each of the word line contact WC and the bit line contact BC. On the other hand, the drawn wire portions 151 corresponding to the word line WL2 and the bit lines BL1 and BL2 sandwiched between these wires (the word lines WL1 and WL3) are formed by the method illustrated in FIG. 20A to FIG. 21. In other words, at the formation of the drawn wire portion 151, it is needed to apply the process of separately forming a pattern between a case of forming a plate-shaped pattern and a case of forming a wire pattern with a width of the minimum half pitch depending on a layer. As a result, the number of processes is reduced only for part of the wiring layers. Thus, in the second embodiment, the case is explained in which the drawn wire portion 151 is formed with the wire pattern with a width of the minimum half pitch for all of the wiring layers of the memory layer.

Figure 23A:
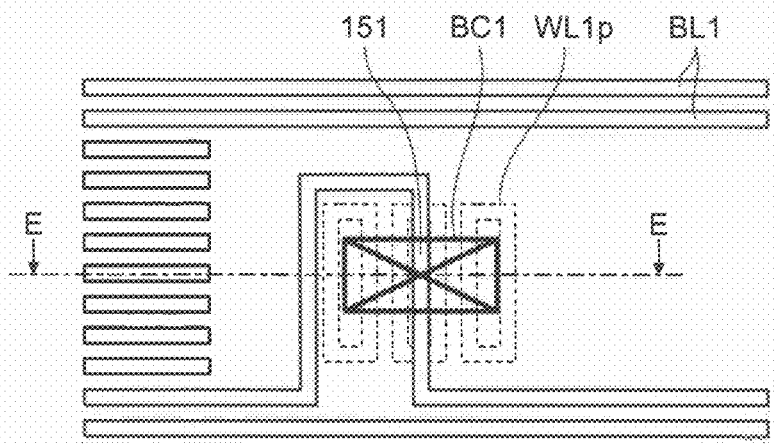
FIG. 23A and FIG. 23B are diagrams schematically illustrating a state of a contact portion of a nonvolatile memory device in a second embodiment.
Figure 23B:
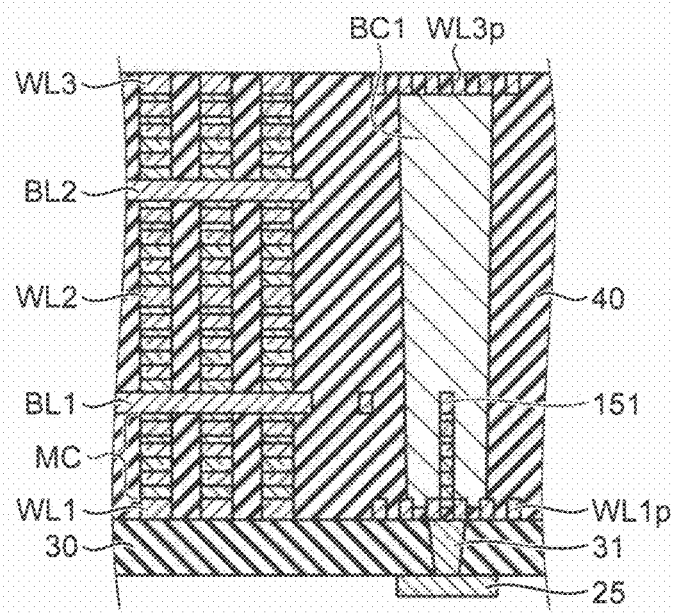

FIG. 23A and FIG. 23B are diagrams schematically illustrating a state of the contact portion of the nonvolatile memory device in the second embodiment, in which FIG. 23A is a plan view at a position at which the bit lines BL1 are formed and FIG. 23B is an E-E cross-sectional view of FIG. 23A. In this example, only one bit line contact BC1 is illustrated for convenience sake of explanation. Moreover, components that are the same as those described above are given the same reference numerals and explanation thereof is omitted.

In the second embodiment, a wire in the bottom layer, i.e., the landing pad WL1p formed in the wiring layer same as the word line WL1 has a structure in which a plurality of loop-shaped patterns, each of which is formed by connecting both end portions of two lines extending in the word line direction, is arranged in the bit line direction. The half pitch of the line portion extending in the word line direction is the minimum half pitch in the similar manner to a wire of the memory cell array layer. In FIG. 23B, the landing pad WL3p on the upper end side of the bit line contact BC1 is also formed into loop-shaped patterns in the similar manner to the landing pad WL1p, however, can be a rectangular-shaped pattern. The bit line contact BC1 is explained in this example, however, the landing pads WL1p and WL3p in the word-line-contact forming region also have the similar structure.

Figure 24A:
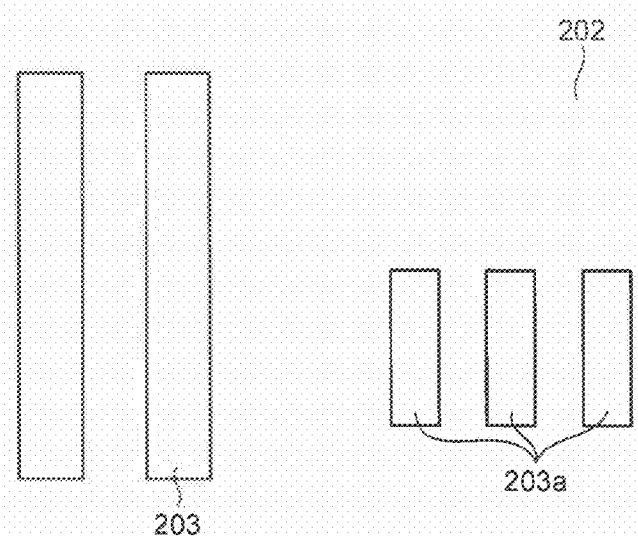
FIG. 24A to FIG. 24C are plan views schematically illustrating an example of a procedure of a manufacturing method of the nonvolatile memory device in the second embodiment.
Figure 24B:
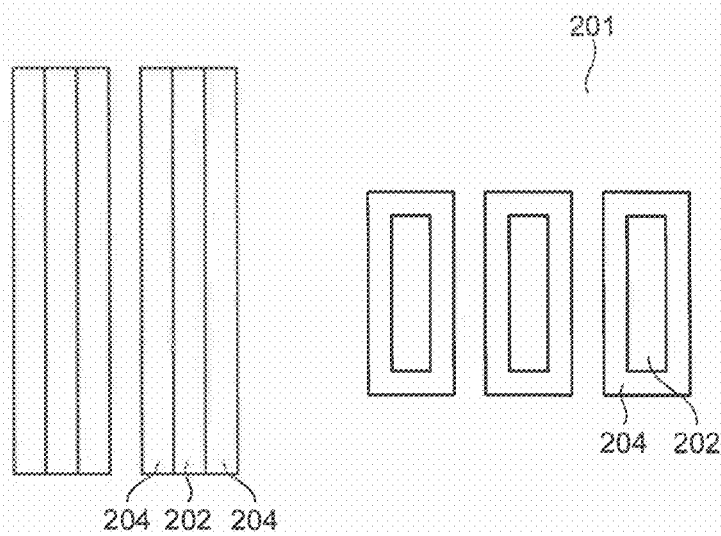
Figure 24C:
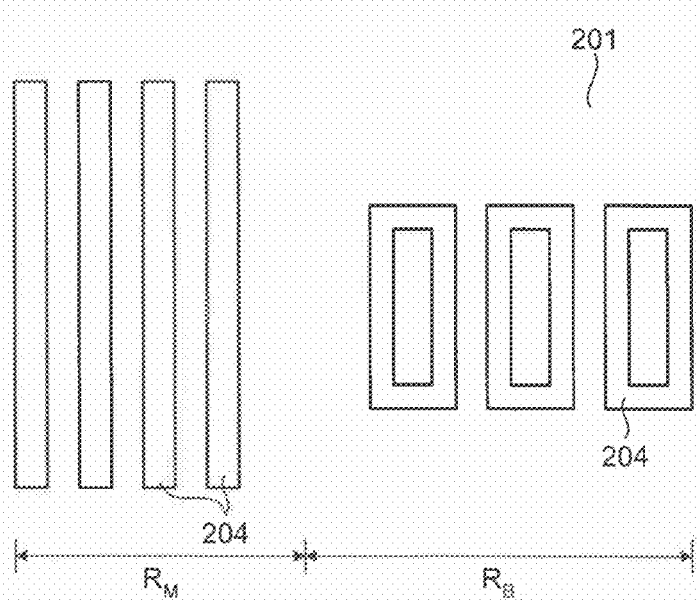

FIG. 24A to FIG. 24C are plan views schematically illustrating an example of a procedure of the manufacturing method of the nonvolatile memory device in the second embodiment. FIG. 25A to FIG. 28C are diagrams schematically illustrating an example of the manufacturing method of the nonvolatile memory device in the second embodiment, in which FIG. 25A to FIG. 28A are plan views, FIG. 25B to FIG. 28B are F-F cross-sectional views of FIG. 25A to FIG. 28A, and FIG. 28C illustrates another example of the F-F cross-sectional view of FIG. 28A. First, when patterning the resist 203 in FIG. 3A and FIG. 3B, as shown in FIG. 24A, line and space shaped patterns 203a are formed also at the formation position of the landing pad WL1p of each of the word line contact WC and the bit line contact BC in the word-line-contact forming region and the bit-line-contact forming region. These patterns 203a are arranged with predetermined intervals in the bit line direction, for example, in an area approximately the same as the landing pad WL1p in FIG. 19A and FIG. 19B.

Next, with the procedure illustrated in FIG. 4A to FIG. 6B, the core film 202 is processed by using the resist 203 in which the patterns are formed to be slimmed so that the line and space shaped pattern has a predetermined dimension (for example, minimum half pitch). Thereafter, as shown in FIG. 24B, the spacer film 204 is formed around the core film 202.

Next, as shown in FIG. 24C, the core film 202 is removed by the wet etching process to leave only the spacer film 204. At this time, in the memory-cell forming region RM and the bit-line-contact forming region RB, the loop-shaped patterns formed of the spacer film 204 are left. Although not shown, the loop-shaped patterns are formed in the similar manner in the word-line-contact forming region.

Then, as shown in FIG. 8A to FIG. 9B, after performing the process of processing the mask film 201 with this loop-shaped spacer film 204 as a mask and dividing the loop-shaped pattern for wire formation in the memory-cell forming region into the word lines WL, layers from the cap film 108 to the wire material layer 101 are sequentially processed with the mask film 201 as a mask, and the third inter-layer dielectric film 40 is embedded between the processed stacked films.

Thereafter, in the similar manner to the process shown in FIG. 20A to FIG. 20C, layers from the barrier metal film 112 to the core film 212 are stacked on the third inter-layer dielectric film 40 in the state where the cap film 108 is exposed, and the patterns for wire formation having the minimum half pitch for forming the bit lines BL1 are formed on the mask film 211.

Figure 25A:
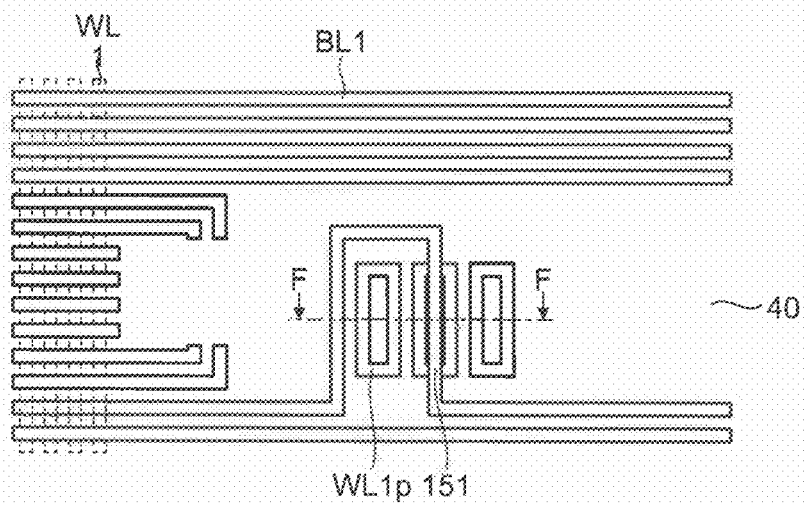
FIG. 25A to FIG. 28C are diagrams schematically illustrating an example of the manufacturing method of the nonvolatile memory device in the second embodiment.
Figure 25B:
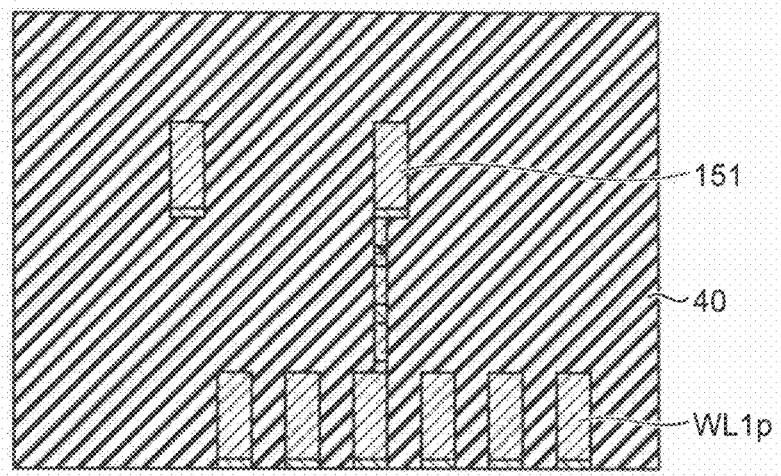
Figure 26A:
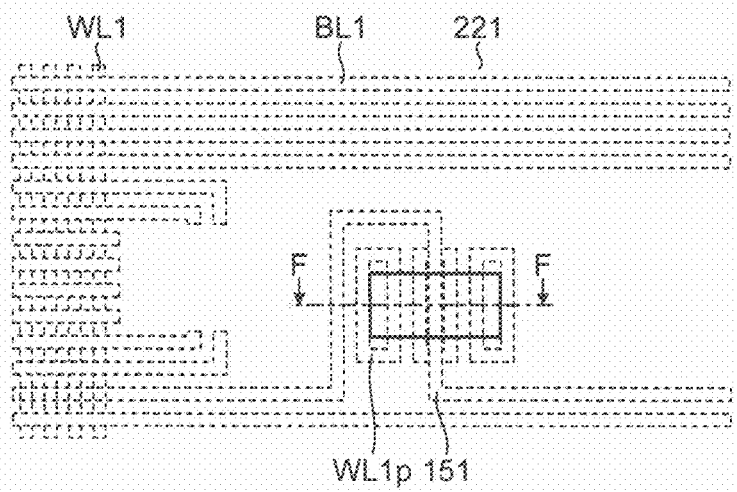
Figure 26B:
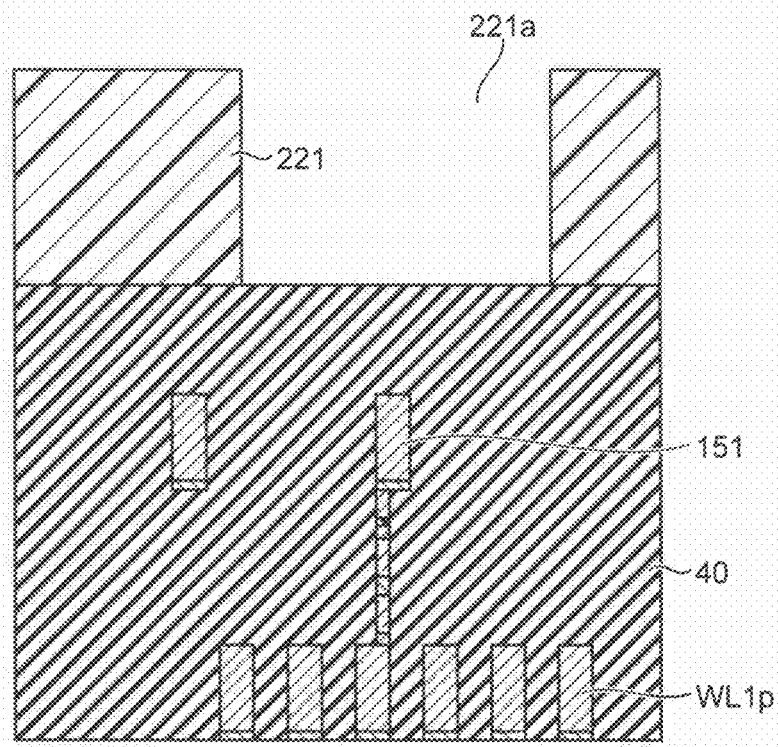

Next, as shown in FIG. 25A, after collectively processing layers from the cap film 118 to the barrier metal film 104 with the mask film 211, the third inter-layer dielectric film 40 is embedded between the processed patterns. Then, the process as above is repeated to stack a plurality of memory cell array layers. Thereafter, as shown in FIG. 26A and FIG. 26B, a resist 221 is applied to the third inter-layer dielectric film 40 and patterning is performed so that an opening 221a is formed in the formation positions of the word line contact WC and the bit line contact BC. At this time, the memory-cell forming region is covered with the resist 221.

Figure 27A:
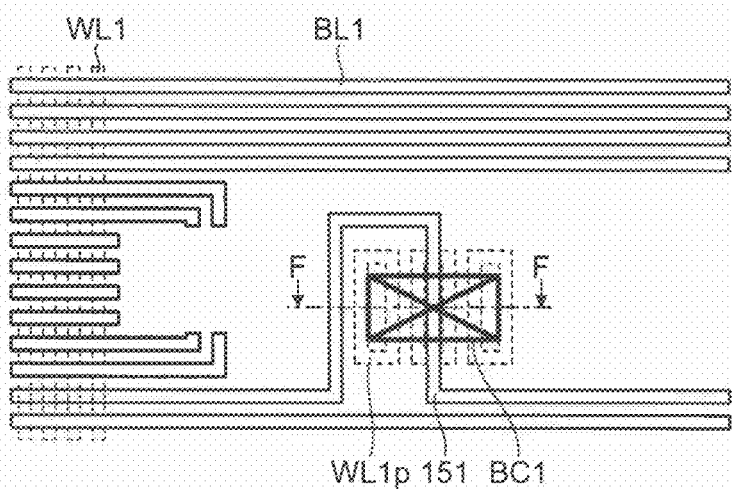
Figure 27B:
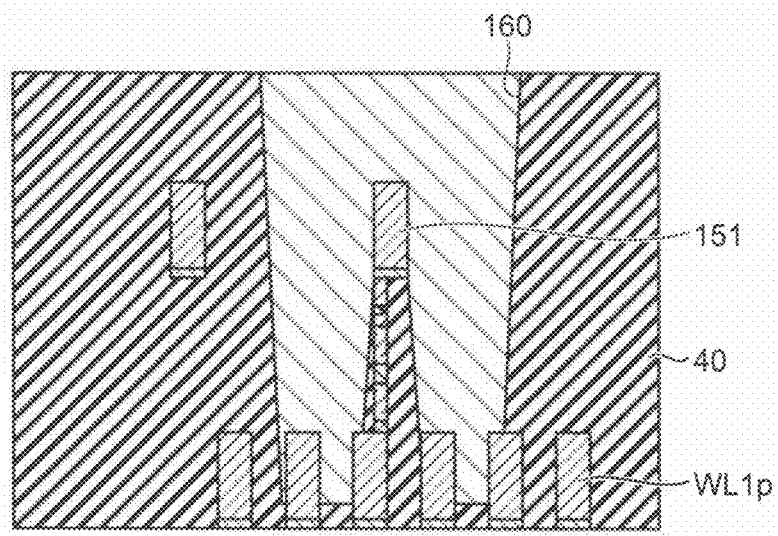

Next, as shown in FIG. 27A and FIG. 27B, the third inter-layer dielectric film 40 is processed with the resist 221 as a mask to form the contact hole 160. At this time, when the drawn wire portion 151 is provided at the formation position of the contact hole 160, the drawn wire portion 151 functions as a mask and this portion is not etched, and a portion other than the formation region of the drawn wire portion 151 in the contact hole 160 is etched. Etching of this contact hole 160 is performed until reaching the landing pad WL1p. Thereafter, a conductive material is embedded in the contact hole 160 to form the word line contact WC and the bit line contact BC1.

Figure 28A:
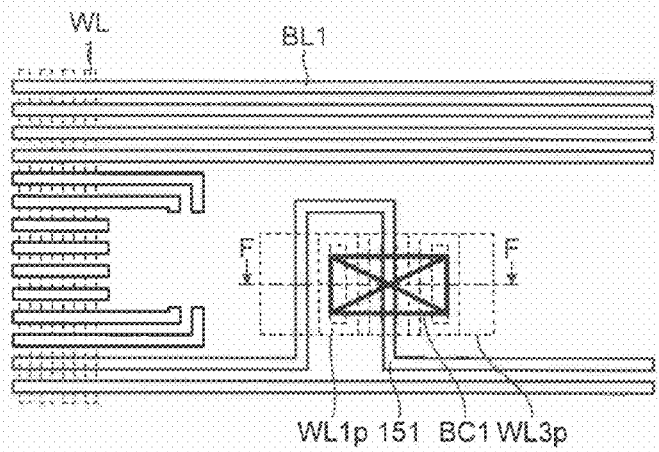
Figure 28B:
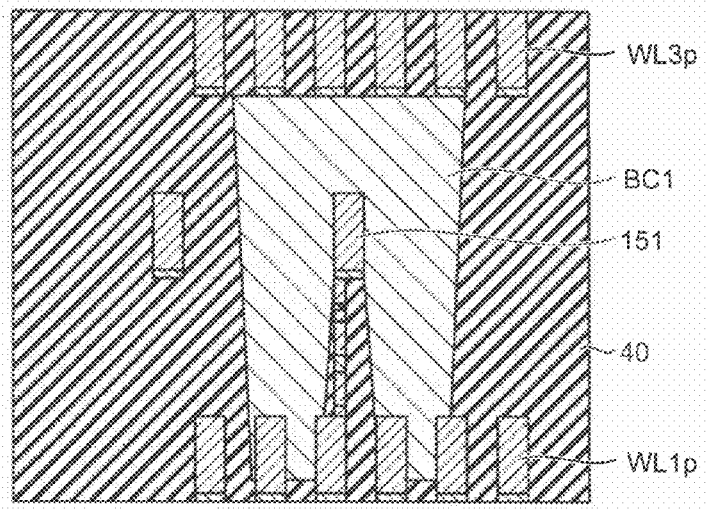
Figure 28C:
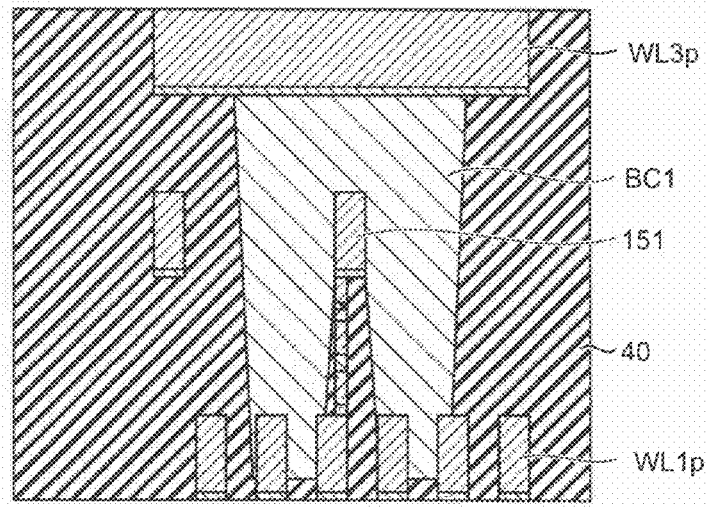

Next, as shown in FIG. 28A to FIG. 28C, the landing pad WL3p that is connected to the upper layer wire is formed on the formation positions of the word line contact WC and the bit line contact BC1. As shown in FIG. 28B, this landing pad WL3p can be formed by arranging a plurality of loop-shaped patterns with a predetermined size same as the landing pad WL1p, or, as shown in FIG. 28C, the landing pad WL3p can be formed by arranging a rectangular pattern with an area wider than the contact hole 160. The upper layer wire is connected to the peripheral circuit via this landing pad WL3p.

In this manner, the landing pad WL1p formed at a height at which the word line WL1 is arranged becomes the ring-shape wire, and the word line contact WC or the bit line contact BC is connected to the upper surface and the side surface of this ring-shaped wire. When the landing pad WL1p is the ring-shaped wire, the inter-layer dielectric film in the ring gap may be etched and come into contact with the lower-layer wire 25 of the peripheral circuit (CMOS region) present in further lower layer by overetching at the contact hole processing. However, the gap of the ring-shaped wire has a critical dimension and therefore has a high aspect ratio at the processing, so that etching stop occurs. Therefore, there is a little possibility that the contact hole reaches the lower portion and the word line contact WC or the bit line contact BC comes into contact with the lower-layer wire 25. For eliminating such concerns, etching can be caused to stop by forming an etching stopper film, such as SiN, between the word line WL1 and the lower-layer wire 25 as needed.

In the second embodiment, the landing pads WL1p and WL3p are also formed with a plurality of ring-shaped wires having a width of the minimum half pitch. Consequently, there is no need to separately form the landing pads WL1p and WL3p or the drawn wire portions 151 connected to the word line contact WC and the bit line contact BC for each memory cell array layer between the case of forming it into a plate-shaped pattern and the case of forming it into a wiring pattern with a width of the minimum half pitch. As a result, the number of processes can be further reduced compared to the case of the first embodiment.

(Third Embodiment)

Figure 29:
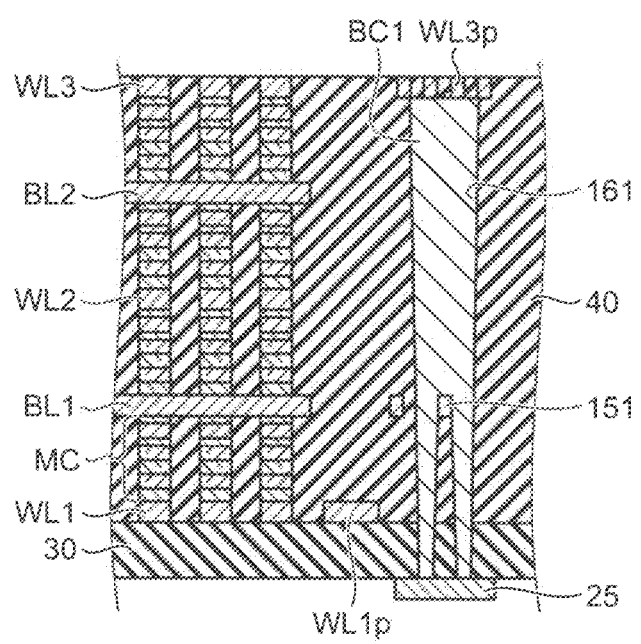
FIG. 29 is a cross-sectional view schematically illustrating a state of a contact portion of a nonvolatile memory device in a third embodiment.

FIG. 29 is a cross-sectional view schematically illustrating a state of a contact portion of a nonvolatile memory device in the third embodiment. In this example, only one bit line contact BC1 is illustrated for convenience sake of explanation. Moreover, components that are the same as those described above are given the same reference numerals and explanation thereof is omitted.

As shown in FIG. 29, in the third embodiment, the landing pad WL1p corresponding to the height at which the word line WL1 is formed is not provided to the bit line contact BC1, a contact hole 161 is provided which reaches the lower-layer wire 25 directly connected to an element configuring the peripheral circuit formed on a not-shown semiconductor substrate, and a conductive material is embedded in this contact hole 161, to form the bit line contact BC1. The word line contact WC2 and the bit line contact BC2 other than the word line contact WC1 have the similar structure.

In the second embodiment illustrated in FIGS. 23A and 23B, the landing pad WL1p at the bottom of the word line contact WC and the bit line contact BC has a ring shape and the word line contact WC and the bit line contact BC may penetrate through the landing pad WL1p, however, in the third embodiment, as shown in FIG. 29, the layout is such that a connection portion at a contact bottom hooked on the upper portion wire (in this example, the bit line BL1) is directly dropped on the lower-layer wire 25 instead of the landing pad WL1p. Therefore, it is possible to prevent short-circuit with the lower-layer wire 25 due to the penetration of the contact.

For the word line WL1 of the bottom layer, it is possible to omit the landing pad WL1p and directly drop the word line contact WC and the bit line contact BC on the lower-layer wire 25, however, for the upper portion wires such as the word line WL3, the landing pad WL3p thereof cannot be omitted. This is because if the landing pad WL3p thereof is omitted, the word line WL3 and the word line contact WC1 cannot be connected. However, for example, when a plurality of the memory layers ML each including four memory cell array layers MA in FIG. 1A and FIG. 1B is stacked, the word line contact WC and the bit line contact BC of the memory layer ML of the upper layer are arranged just under the word line contact WC and the bit line contact BC of the memory layer ML of the lower layer, so that the landing pads WL3p on the bottom of the word line contact WC and the bit line contact BC of the memory layer of the upper layer can have a ring shape in the similar manner to the second embodiment. This is because even if penetration due to overetching of the upper portion contact occurs, upper and lower contacts have a series structure, so that there is no problem in electrical characteristics.

According to the third embodiment, even if the process of separately forming a wide wire for all wiring layers is omitted and the connection portion with the contact is formed into a line with the critical dimension, an effect is obtained that decrease in yield due to short-circuit with the lower-layer wire 25 because of overetching of the contact can be suppressed.

In the above explanation, explanation is given with the variable resistance memory as an example as the nonvolatile memory, however, the above embodiments can also be applied to a pad portion of a contact of a three-dimensional cross-point type memory such as a phase change memory, a drawn portion of a control gate electrode of a NAND-type flash memory, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
    a peripheral circuit that includes a control element that controls a nonvolatile memory cell formed above a substrate;
    a first wire that is formed above the peripheral circuit via an inter-layer dielectric film and is connected to the control element;
    a memory layer in which a plurality of memory-cell-array layers is stacked on the inter-layer dielectric film in which the first wire is formed, each of the memory-cell-array layers including a plurality of nonvolatile memory cells each of which includes a nonvolatile memory element arranged at intersection positions of a plurality of second wires that extend in a first direction and a plurality of third wires that are formed at a height different from the second wires and extend in a second direction, the nonvolatile memory element being sandwiched between the second wires and the third wires;
    contact plugs that connect between the second wires and the first wire and between the third wires and the first wire, and are formed in a peripheral portion of the memory layer; and
    drawn wire portions that are connect the second wires and the third wires with the contact plugs in the memory layer, wherein
    the drawn wire portions that are connected to a second wire and a third wire other than a second wire and a third wire of a bottom layer and a top layer of the memory layer are formed of a wire with a critical dimension in the nonvolatile memory device same as the second wires and the third wires and include two straight line portions that extend in a direction vertical to an extending direction of the second wires or the third wires and one of the straight line portions is connected to the contact plug on an upper surface and both side surfaces of the one of the straight line portions.

2. The nonvolatile memory device according to claim 1, wherein one of the drawn wire portions is routed in a U shape from the second wire in a direction orthogonal to the second wire to come into contact with a respective contact plug.

3. The nonvolatile memory device according to claim 1, wherein a lower end of each contact plug is connected to a pad of the bottom layer of the memory layer, and
    the pad includes a plurality of loop-shaped wires having a width of the critical dimension same as the second wires and the third wires.

4. The nonvolatile memory device according to claim 3, wherein
    each of the loop-shaped wires includes a connection portion that connects both ends of a pair of adjacent straight line portions, and
    the straight line portions have a wire width of the critical dimension and are arranged in a direction vertical to an extending direction of the straight line portions so as to form a line and space pattern.

5. The nonvolatile memory device according to claim 1, wherein a lower end of the contact plug is connected to the first wire without a pad of the bottom layer of the memory layer.

6. The nonvolatile memory device according to claim 1, wherein
    the memory layer includes a plurality of memory layers, and
    the contact plug of a memory layer other than a bottom layer is provided to correspond to a contact formation position of a memory layer on a lower layer side of the memory layer.

7. The nonvolatile memory device according to claim 1, wherein the second wires are connected to a same contact plug every other memory layer.

8. The nonvolatile memory device according to claim 1, wherein the nonvolatile memory element is a variable resistive element or a phase change memory.

* * * * *